United States Patent
Ranade et al.

(10) Patent No.: US 11,995,882 B2
(45) Date of Patent: May 28, 2024

(54) MACHINE-LEARNING BASED SOLVER OF COUPLED-PARTIAL DIFFERENTIAL EQUATIONS

(71) Applicant: ANSYS, INC., Canonsburg, PA (US)

(72) Inventors: Rishikesh Ranade, Bridgeville, PA (US); Derek Christopher Hill, Grantham, NH (US); Jay Prakash Pathak, Pleasanton, CA (US)

(73) Assignee: ANSYS, INC., Canonsburg, PA (US)

( * ) Notice: Subject to any disclaimer, the term of this patent is extended or adjusted under 35 U.S.C. 154(b) by 835 days.

(21) Appl. No.: 16/947,606

(22) Filed: Aug. 10, 2020

(65) Prior Publication Data

US 2021/0303971 A1    Sep. 30, 2021

Related U.S. Application Data

(60) Provisional application No. 62/704,530, filed on May 14, 2020, provisional application No. 62/994,625, filed on Mar. 25, 2020.

(51) Int. Cl.
| | |
|---|---|
| *G06N 3/045* | (2023.01) |
| *G06F 18/24* | (2023.01) |
| *G06F 30/27* | (2020.01) |
| *G06N 3/02* | (2006.01) |
| *G06N 3/08* | (2023.01) |
| *G06V 10/764* | (2022.01) |
| *G06V 10/82* | (2022.01) |
| *G06N 3/00* | (2023.01) |
| *G06N 3/084* | (2023.01) |

(52) U.S. Cl.
CPC .............. *G06V 10/82* (2022.01); *G06F 18/24* (2023.01); *G06F 30/27* (2020.01); *G06N 3/02* (2013.01); *G06N 3/045* (2023.01); *G06N 3/08* (2013.01); *G06V 10/764* (2022.01); *G06N 3/002* (2013.01); *G06N 3/084* (2013.01)

(58) Field of Classification Search
CPC ....................................................... G06N 3/045
USPC ....................................................... 706/6, 45
See application file for complete search history.

(56) References Cited

U.S. PATENT DOCUMENTS

2021/0295167 A1    9/2021    Hill

OTHER PUBLICATIONS

Joshi, et al., Generative Models for Solving Nonlinear Partial Differential Equations, Second Workshop on Machine Learning and the Physical Sciences (NeurIPS 2019), Vancouver, Canada, pp. 1-6 (Year: 2019).*

(Continued)

*Primary Examiner* — Wilbert L Starks

(74) *Attorney, Agent, or Firm* — Womble Bond Dickinson (US) LLP

(57) ABSTRACT

Partial differential equations used to simulate physical systems can be solved, in one embodiment, by a solver that has been trained with a set of generative neural networks that operated at different resolutions in a solution space of a domain that defines the physical space of the physical system. The solver can operate in a latent vector space which encodes solutions to the PDE in latent vectors in the latent vector space. The variables of the PDE can be partially decoupled in the latent vector space while the solver operates. The domain can be divided into subdomains that are classified based on their positions in the domain.

26 Claims, 14 Drawing Sheets

(56) References Cited

OTHER PUBLICATIONS

Farahmand, et al., Deep Reinforcement Learning for Partial Differential Equation Control, 2017 American Control Conference (ACC), 2017, pp. 3120-3127 (Year: 2017).*
Final Office Action for U.S. Appl. No. 16/827,037 dated Jun. 13, 2023, 43 pages.
Non-Final Office Action for U.S. Appl. No. 16/827,037 dated Feb. 21, 2023, 32 pages.
Non-Final Office Action for U.S. Appl. No. 16/827,037 dated Dec. 14, 2023, 47 pages.
Lee et al., "Neural Algorithm for Solving Differential Equations," Journal of Computational Physics, 91, 110-131 (1990), 22 pages.
Lagaris et al., "Artificial Neural Networks for Solving Ordinary and Partial Differential Equations," IEEE Transactions of Neural Networks, vol. 9, No. 5, Sep. 1998, 14 pages.
Raissi et al., "Hidden Physics Models: Machine Learning of Nonlinear Partial Differential Equations," Journal of Computational Physics, 357 (2018) 125-141, 17 pages.
Raissi et al., "Physics Informed Deep Learning (Part I): Data-Driven Solutions of Nonlinear Partial Differential Equations," arXiv:1711.10561v1[cs.AI], pp. 1-22, Nov. 28, 2017, 22 pages.
Baydin et al., "Automatic Differentiation in Machine Learning: a Survey," Journal of Machine Learning Research, 18 (2018) 1-43, 43 pages.
Dwivedi et al., "Distributed Physics Informed Neural Network for Data-Efficient Solution to Partial Differential Equations," arXiv:1097.08967v1 [cs. LG], pp. 1-16, Jul. 21, 2019, 16 pages.
Sun et al., "Surrogate Modeling for Fluid Flows Based on Physics-Constrained Deep Learning Without Simulation Data," ScienceDirect, Compu. Methods Appl. Mech Engrg 361 (2020) 112732, 25 pages.
Zhu et al., "Physics-Constrained Deep Learning for High-Dimensional Surrogate Modeling and Uncertainty Quantification Without Labeled Data," Journal of Computational Physics, 394 (2019) 56-81, 26 pages.
Rao et al., "Physics-Informed Deep Learning for Incompressible Laminar Flows," arXiv:2002.10558v2 [physics.flu-dyn], pp. 1-6, Apr. 22, 2020, 6 pages.
Jin et al., NSFnets (Navier-Stokes Flow nets): Physics-Informed Neural Networks for the Incompressible Navier-Stokes Equations, arXiv:2003.06496v1 [physics.comp-ph], pp. 1-35, Mar. 13, 2020, 35 pages.
Zhuang et al., "Learned Discretizations for Passive Scalar Advection in a 2-D Turbulant Flow," arXiv:2004.05477v2 [physics.comp-ph], pp. 1-14, Nov. 5, 2020, 14 pages.
Bar-Sinai et al., "Learning Data Driven Discretizations for Partial Differential Equations," arXiv:1808.04930v4 [cond-mat.dis-nm], pp. 1-16, Jun. 26, 2019, 16 pages.
Hsieh et al., "Learning Neural PDE Solvers With Convergence Guarantees," Published as a conference paper at ICLR, arXiv:1906.01200v1 [cs.NA], pp. 1-14, Jun. 4, 2019, 14 pages.
Stevens et al., "FiniteNet: A Fully Convolutional LSTM Network Architecture for Time-Dependent Partial Differential Equations," arXiv:2002.03014v1 [cs.LG], pp. 1-10, Under review for ICML 2020, Feb. 7, 2020, 10 pages.
Osher et al., "Fronts Propagating with Curvature-Dependent Speed: Algorithms Based on Hamilton-Jacobi Formulations," Journal of Computational Physics, 79, 12-49 (1988), 38 pages.
Rhie et al., "Numerical Study of the Turbulent Flow Past an Airfoil with Trailing Edge Separation," AIAA Journal, vol. 21, No. 11, Nov. 1983, 8 pages.
Patankar, Suhas V., "A Calculation Procedure for Two-Dimensional Elliptic Situations," Numerical Heat Transfer, 4:4, 409-425, DOI:10.1.1080/01495728108961801, May 21, 2007, 18 pages.
Seo et al., "A Sharp-Interface Immersed Boundary Method with Improved Mass Conservation and Reduced Spurious Pressure Oscillations," Journal of Computational Physics, 230 (2011) 7347-7363, 17 pages.
Tucker et al., "A Cartesian Cut Cell Method for Incompressible Viscous Flow," Applied Mathematical Modelling, 24 (2000) 591-606, 16 pages.
Chollet, Francois, "Introducing Keras 1.0," The Keras Blog, Apr. 11, 2016, 2 pages.
ANSYS Fluent 12.0 Theory Guide, 19.3.1 Gradient Adaption Approach, Jan. 23, 2009, 3 pages.
ANSYS Fluent 12.0 Theory Guide, 19.3.2 Example of Steady Gradient Adaption, Jan. 23, 2009, 2 pages.
Gelfgat, Alexander Yu, "Linear Instability of the Lid-Driven Flow in a Cubic Cavity," Theor. Comput. Fluid Dyn. (2019) 33:59-82, 24 pages.
Kipf et al., "Semi-Supervised Classification with Graph Convolutional Networks," Published as a conference paper at ICLR 2017, arXiv:1609.02907v4 [cs.LG], pp. 1-14, Feb. 22, 2017, 14 pages.
Hochreiter et al., "Long Short-Term Memory," Neural Computation, 9 (8) (1997) 1735-1780, 46 pages.
Raissi et al., "Physics-Informed Neural Networks: A Deep Learning Framework for Solving Forward and Inverse Problems Involving Nonlinear Partial Differential Equations," Journal of Computational Physics, 378 (2019) 686-707, 22 pages.

* cited by examiner

MACHINE-LEARNING BASED SOLVER OF COUPLED-PARTIAL DIFFERENTIAL EQUATIONS

This application claims priority to and the benefit of the following US provisional patent applications: 62/994,625, filed Mar. 25, 2020; and 62/704,530, filed May 14, 2020, and both of these prior US provisional patent applications are hereby incorporated herein by reference.

Designers and manufacturers are increasingly using computer aided design (CAD) systems, such as computers that execute simulation software, to design products such as automobiles, airplanes, airplane engines, heating and cooling systems, etc. The use of such CAD systems allow the designers and manufacturers to test out different designs using the software without requiring that the design be built. For example, thermo-mechanical fatigue testing or thermal analysis of a proposed product, based on a design, can be performed on a simulated design of the product before the product is fabricated to determine when and how the product will fail. Similarly, a design of an airplane's wing, or other part, can be tested in the CAD system before the wing is fabricated to determine how well the wing will behave based on, for example, fluid flow of air around the wing while in flight. This testing by simulation can allow a designer to consider different possible designs and reject some of them based on the results of the simulation before the product is even fabricated. Moreover, results of one or more simulations can cause a designer to revise the design to improve its behavior or performance.

CAD systems often struggle to provide fast answers or simulation results because the computations required to produce the results are often enormous, and hence large and expensive computational processing resources may be required to achieve results in a useful timeframe. The simulations often require solutions to partial differential equations (PDE) that represent laws of physics or models of the physical systems being simulated. Solving these physics based PDEs normally requires large computation resources, especially when the associated physics is highly non-linear.

SUMMARY OF THE DESCRIPTION

In one embodiment, a solver implemented in a data processing system can be used to solve one or more partial differential equations (PDEs), such as a set of PDEs that are coupled with each other and used to simulate physical systems. The solver can be implemented in simulation software that includes one or more trained models such as one or more trained neural networks that have been trained to solve the one or more coupled PDEs. The solver can be created by a set of generative neural networks that were trained at different resolutions in a solution space of a domain that defines the physical space of the physical system using different sets of subdomains. The solver can operate in a latent vector space which encodes solutions to the PDE in latent vectors in the latent vector space. The variables of the PDE can be partially decoupled in the latent vector space while the solver operates to generate solutions. The domain can be divided into subdomains that are classified based on their positions (e.g., corner, boundary or interior) in the domain.

In one embodiment, the solver can be created by a data processing system (e.g., a training system) that performs a method that includes the following operations: (a) generating a set of geometry and boundary condition encodings for all variables of a partial differential equation (PDE), or set of PDEs, that describes a model or law of physics that is used to simulate a physical object in a simulation; (b) training a first generative neural network, which is part of a first set of generative neural networks, at a first resolution using a first set of subdomains contained within a domain that represents an overall solution space, the first generative neural network trained to solve the PDE for the set of geometry and boundary condition encodings through a validation of candidate solutions by a discretized version of the PDEs; and (c) training a second generative neural network, which is part of the first set of generative neural networks, at a second resolution using a second set of subdomains contained within the domain, the second generative neural network trained to solve the PDE for the set of geometry and boundary condition encodings through validation of candidate solutions by the discretized version of the PDE; and wherein the first resolution and the second resolution are different grid resolutions in the solution space represented by the domain. In one embodiment, the solutions of the PDE by the first generative neural network (NN) are generated independently of the solutions of the PDE by the second generative NN, and wherein each subdomain in the first set of subdomains has a first size and each subdomain in the second set of subdomains has a second size that is different than the first size and wherein the PDE has coupled variables. In one embodiment, the method performed by the training system can also include the following operations: combining trained solutions from the first generative neural network and the second generative neural network to provide a combined set of trained candidate solutions; and training a third generative neural network to learn these combined set of candidate solutions for decoupled variables of the PDE.

The third generative neural network can be trained to represent candidate solutions of each of the decoupled variables in separate latent vector spaces. The different solutions of decoupled variables have distinct representation in their encoded latent vector spaces.

In one embodiment, the method performed by the training system can further include the operation of training a set of neighborhood generative neural networks to learn relationships among neighboring subdomains within the domain in the encoded latent vector space, wherein the set of neighborhood generative neural networks comprises a plurality of neighborhood generative neural networks. In one embodiment, the set of neighborhood generative neural networks are not trained on actual PDE solutions but rather are trained on encoded latent representations of those PDE solutions and as well as the boundary and geometry encoded representations on neighboring subdomains. In one embodiment, the method performed by the training system can further include the operation of classifying each of the subdomains, based upon their portion in the domain, into one of three classes: an interior subdomain; a boundary subdomain; and a corner sub domain; and wherein the plurality of neighborhood generative neural networks comprises: an interior subdomain neighborhood generative neural network to train based on data associated with subdomains classified as an interior subdomain; a boundary subdomain neighborhood generative neural network to train based on data associated with subdomains classified as a boundary subdomain; and a corner subdomain neighborhood generative neural network to train based on data associated with subdomains classified as a corner subdomain. In one embodiment, all trained solutions from the first set of generative neural networks can be combined together in a set of combined subdomains, and the combining can be performed by sampling solution values from all of the trained solutions (from the first set of generative neural networks) at the different resolutions over all of the different subdomains. These combined subdomains can be used in the training processes of the third generative neural network and the plurality of neighborhood generative neural networks.

In one embodiment, the third generative neural network comprises: encoder networks that encode PDE solutions to latent space vectors for each of the decoupled variables; and decoder networks that decode latent space vectors to PDE solutions for each of the decoupled variables. In one embodiment, the decoupled variables are coupled by the set of neighborhood generative neural networks by concatenating their latent vectors in the latent spaces. In one embodiment, these decoder networks are also conditioned on encodings of geometry and boundary conditions on each subdomain; the geometry and boundary condition encodings are obtained from weights of pretrained geometry and boundary encoders.

In one embodiment, the method performed by the training system can further include the operation of: generating a deployable neural network for use in a solver to solve PDEs in simulations of physical systems, the deployable neural network based on results from the first set of generative neural networks, the third generative neural network and the set of neighborhood neural networks.

Once a solver is deployed, it can be used in simulations. The deployment of the solver can occur by distribution of software (e.g., computer programs) or data processing systems that contain the trained solver in the form of, for example, one or more trained neural networks. The distribution can occur by, for example, sale or license of the software or sale or license of the data processing systems to customers or licensees who can then use the solver to simulate physical systems using the solver to solve PDEs.

In one embodiment, a solver, once created by a training system, can perform a method that includes the following operations: (a) receiving geometry data that specifies a domain and receiving one or more boundary conditions for a physical system to be simulated by one or more solutions of a partial differential equation (PDE); (b) storing neighborhood connectivity data for subdomains of the domain; (c) initializing the domain with an initial solution for each variable in the PDE; and (d) solving the PDE, the solving comprising: encoding a solution for each variable in the latent vector space using a trained encoder neural network of a generative neural network that was trained by a set of training generative neural networks that operated at different resolutions in a solution space. In one embodiment, the method can further include the operation of dividing the domain into the subdomains that are classified into different classes of subdomains based on their positions (e.g., corner, boundary, or interior) in the domain. In one embodiment, the encoding can encode a current solution in each subdomain for each variable in the PDE in the latent vector space that is decoupled, from the other variables, in the PDE. In one embodiment the solving, after the encoding, can include the following operations: (a) coupling the PDE variables by concatenating their latent vectors derived from the encoding in each subdomain; (b) determining, by a set of neighborhood generative neural networks, a next encoded solution for each variable in the PDE in the latent vector space; (c) uncoupling, after the next encoded solutions have been determined, the PDE variables and enforcing the boundary conditions and geometry encodings in the latent vector space; (d) iterating, until convergence of a solution of the PDE is achieved based upon a convergence criterion, the operations of coupling, determining and uncoupling; and (e) generating, by a trained decoder neural network of the generative neural network, solutions from converged encoded solutions in the latent vector space in each subdomain and deriving, from the network connectivity data, final solutions for all variables of the PDE over the domain.

In one embodiment, the solver is implemented in a data processing system (e. g., a computer) that stores weights for use in the method performed by the solver, the weights including: trained weights for the trained encoder neural network of the generative neural network; trained weights for the trained decoder neural network of the generative neural network; trained weights for the set of neighborhood generative neural networks; and trained weights of geometry and boundary condition neural networks. In one embodiment, the set of training generative neural networks (used in the training system) generated, prior to beginning the method in the solver, training data that trained the trained decoder neural network of the generative neural network and trained the set of neighborhood generative neural networks.

The solver can be used to perform simulations of physical systems (e.g., a pump) that can be tested in the simulations and then the design of the physical systems can be revised based upon the results from the simulation before even manufacturing the physical systems.

The aspects and embodiments described herein can include non-transitory machine readable media that can store executable computer program instructions that when executed cause one or more data processing systems to perform the methods described herein when the computer program instructions are executed. The instructions can be stored in non-transitory machine readable media such as in dynamic random access memory (DRAM) which is volatile memory or in nonvolatile memory, such as flash memory or other forms of memory.

The above summary does not include an exhaustive list of all embodiments are aspects in this disclosure. All systems, media, and methods can be practiced from all suitable combinations of the various aspects and embodiments summarized above and also those disclosed in the detailed description below.

BRIEF DESCRIPTION OF THE DRAWINGS

The present invention is illustrated by way of example and not limitation in the figures of the accompanying drawings in which like references indicate similar elements.

DETAILED DESCRIPTION

Various embodiments and aspects will be described with reference to details discussed below, and the accompanying drawings will illustrate the various embodiments. The following description and drawings are illustrative and are not to be construed as limiting. Numerous specific details are described to provide a thorough understanding of various embodiments. However, in certain instances, well-known or conventional details are not described in order to provide a concise discussion of embodiments.

Reference in the specification to "one embodiment" or "an embodiment" means that a particular feature, structure, or characteristic described in conjunction with the embodiment can be included in at least one embodiment. The appearances of the phrase "in one embodiment" in various places in the specification do not necessarily all refer to the same embodiment. The processes depicted in the figures that follow are performed by processing logic that comprises hardware (e.g. circuitry, dedicated logic, etc.), software, or a combination of both. Although the processes are described below in terms of some sequential operations, it should be appreciated that some of the operations described may be performed in a different order. Moreover, some operations may be performed in parallel rather than sequentially.

Figure 1:
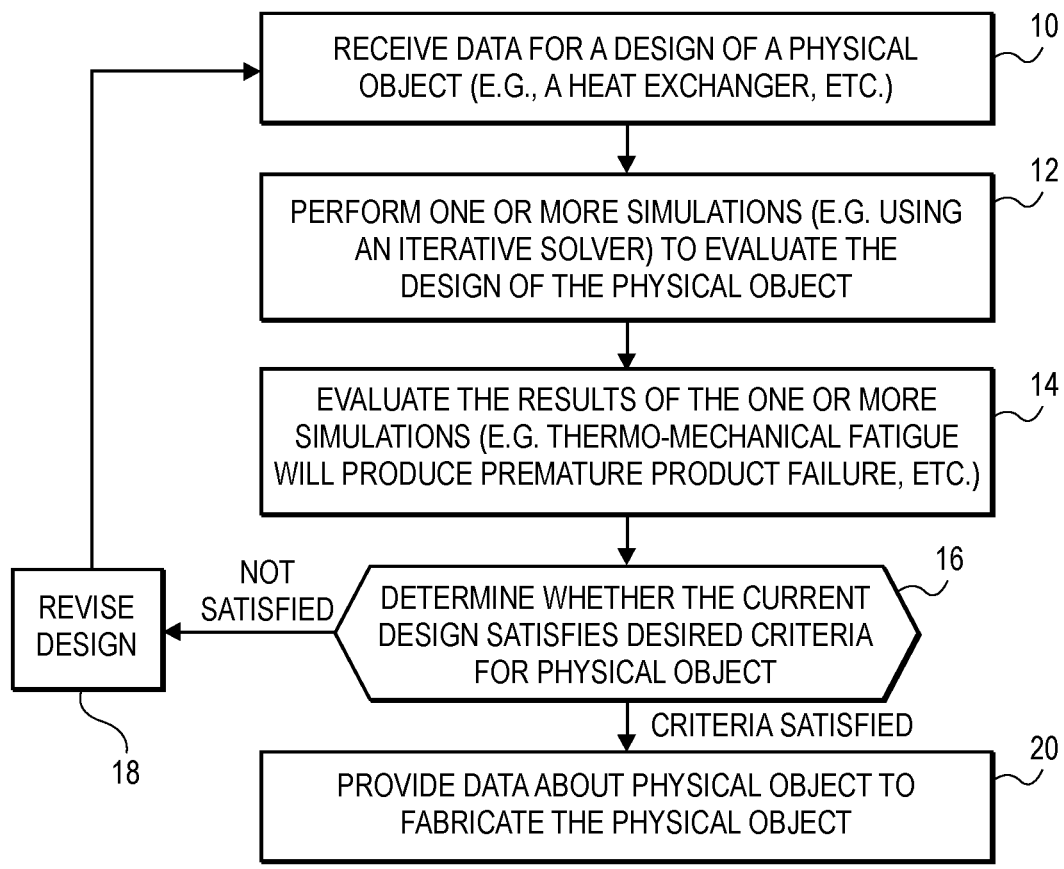
FIG. 1 is a flowchart which illustrates a method which can be used according to one or more embodiments described herein to design and fabricate a physical object such as an airplane wing or a pump, etc.

The embodiments described herein can be used to train a neural network to provide solutions for models of a physical system, where the models are based on a set of one or more partial differential equations. These models can be used in simulations of physical objects and physical systems in order to determine whether a particular design of the physical object or physical system satisfies particular requirements for the object or system. For example, there might be certain design requirements for how an airplane wing should operate while the airplane is flying through a fluid such as air. Similarly, there may be certain design requirements for a heat exchanger which includes pipes and other components in the heat exchanger. FIG. 1 shows a method in which these design requirements can be tested relative to a particular design of a physical object or physical system which is being simulated. In operation 10 of FIG. 1, a data processing system can receive data about a design for a particular physical object. The data can be created in CAD software on a data processing system, and the data can include information about the materials used to fabricate the physical object as well as sizes of different parts of the physical object, the shape of the physical object, etc. Then in operation 12, the data processing system can perform one or more simulations to evaluate the design of the physical object. In one embodiment, the data processing system can perform simulations by using an iterative solver which converges upon a solution for the PDE that specifies parameters relative to the physical object in the simulation. For example, the airplane wing may be subjected to various different fluid flows during the simulation, and information from the simulation may indicate how well or poorly the particular design of the airplane wing performs, such as the amount of lift it can provide, etc. In operation 14, the designer can evaluate the results of one or more simulations to determine whether the design of the physical object satisfies certain desired criteria for the physical object. For example, the designer can determine whether the expected failure rate or product lifecycle indicated in the simulation's results satisfy desired criteria for the physical object. This determination is shown in operation 16. If the criteria is satisfied, then the designer in operation 20 can provide data about the physical object to allow the fabrication or manufacture of the physical object. For example, if the criteria is satisfied, a CAD file can be produced that describes how to build the physical object such as an airplane wing. If the criteria are not satisfied as determined in operation 16, the designer can revise the design in operation 18 (for example, by changing sizes or shapes of parts in the physical object or changing the composition of material(s) in the object, etc.) and repeat the process by performing additional further simulations to evaluate the redesigned physical object. This can be repeated until the desired criteria are achieved for the physical object, and may require the designer change the design in terms of the materials used and other parameters that describe how the physical object will be fabricated or otherwise produced. The simulations performed in operation 12 can use a trained neural network or a set of trained neural networks (also referred to as a trained model or solver) as described herein to provide the simulations which are based upon solutions to PDEs as described herein.

Figure 2A:
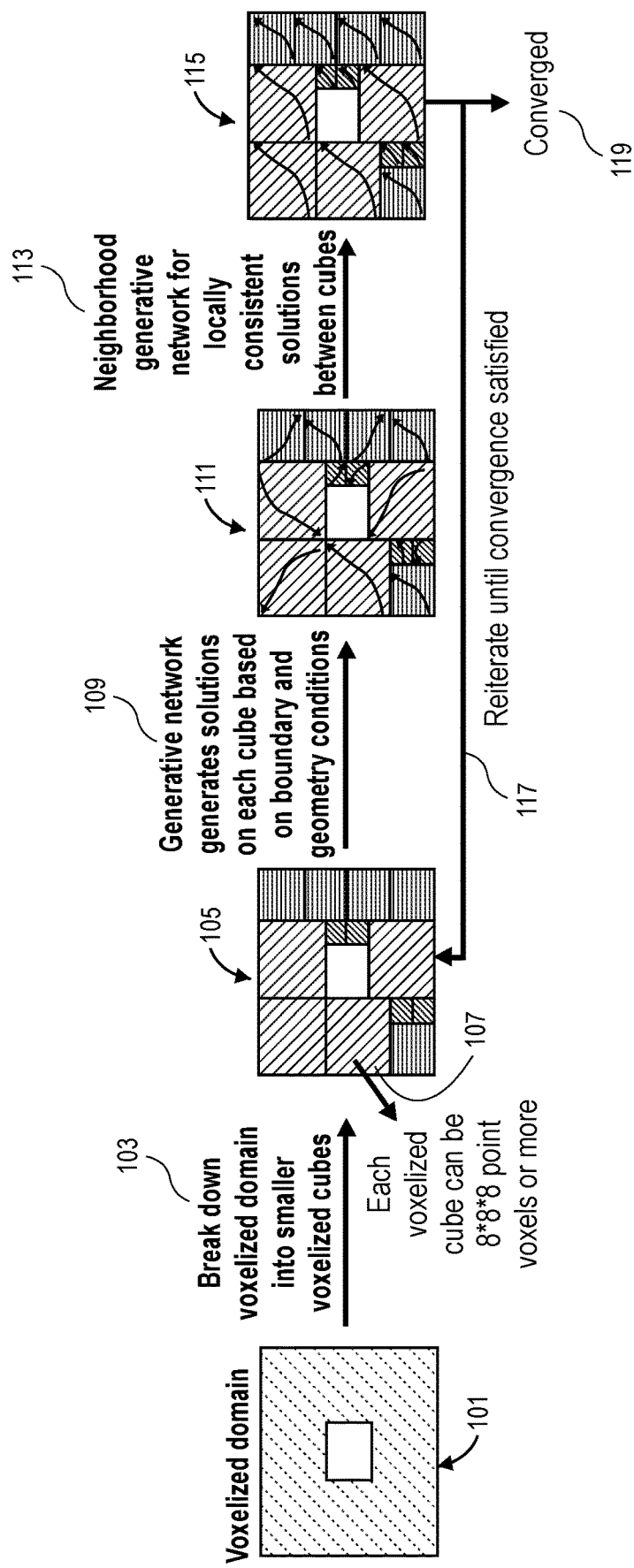
FIG. 2A shows an example of a solver system that can be used to solve a set of one or more PDEs such as coupled PDEs according to one embodiment described herein.

An overview of the process of using a solver according to one embodiment will now be provided while referring to FIG. 2A. The process of using the solver can be performed, after a solver has been trained by a training system that can be a data processing system such as a general purpose computer. The training system can be used to train several different generative models such as several different generative neural networks (NNs). The process, as shown in FIG. 2A, can begin by defining a domain 101 that represents a physical space; the domain can be divided into voxels that collectively cover the entire space within the domain. For example, if the domain represents a physical space that is a three dimensional (3D) cube that is 1 meter (m) by 1 m by 1 m in size, the domain can be divided (or "voxelized") into voxels that can each be, for example, 10 centimeters (cm) by 10 cm by 10 cm. Each voxel can represent (e.g., at its center point) a solution value on a grid, such as a Cartesian coordinate system. PDE solutions can be generated on this grid by a generative NN that was trained. The entire voxelized domain 101 can be further divided (shown as operation 103) into a set 105 of smaller subdomains (such as subdomain 107) that collectively cover the entire space within the domain; these subdomains may be the same size or may have different sizes. The volume within a subdomain may be subdivided into point voxels that can be used as a solution grid within each subdomain when using the solver to solve a PDE within each subdomain. Thus, as shown in FIG. 2A, the space within the subdomain 107 can be voxelized into 8 by 8 by 8 point voxels. Each of the subdomains in the example shown in FIG. 2A can be similarly voxelized. Then in operation 109 shown in FIG. 2A, the weights of a pre-trained set of generative NNs can be used to generate solutions 111 within each subdomain based upon boundary and geometry conditions; further details about the generation of these solutions is provided below. The solutions within each subdomain can be independent of each other since there is no constraint in the generative NNs that would consider the local consistency of solutions between neighboring subdomains. Then in operation 113, a set of pretrained neighborhood generative NNs can be used to learn locally consistent solutions across and between the subdomains (continuous over subdomain boundaries) to produce a set of results 115. The set of results 115 can be checked for convergence 119 to a proper solution for the PDE; if the solution has not converged (based upon a convergence criterion described below), then processing returns 117 back to operation 109. Repeating the entire process over time improves the candidate solutions, and prior candidate solutions, as described further below, can be replaced with new solutions to achieve faster convergence. In one embodiment of the system shown in FIG. 2A, another set of generative NNs (a second set of generative NNs) can receive the solutions from the first set of generative NNs and encode them (by an encoder NN that is part of the second set of generative NNs) as latent vectors in a latent vector space and then decode them (by a decoder NN that is part of the second set of generative NNs); this process in the second set of generative NNs can use decoupled variables in the PDE, and the set of neighborhood generative NNs can couple these variables. Further information about the second set of generative NNs is provided below.

Figure 2B:
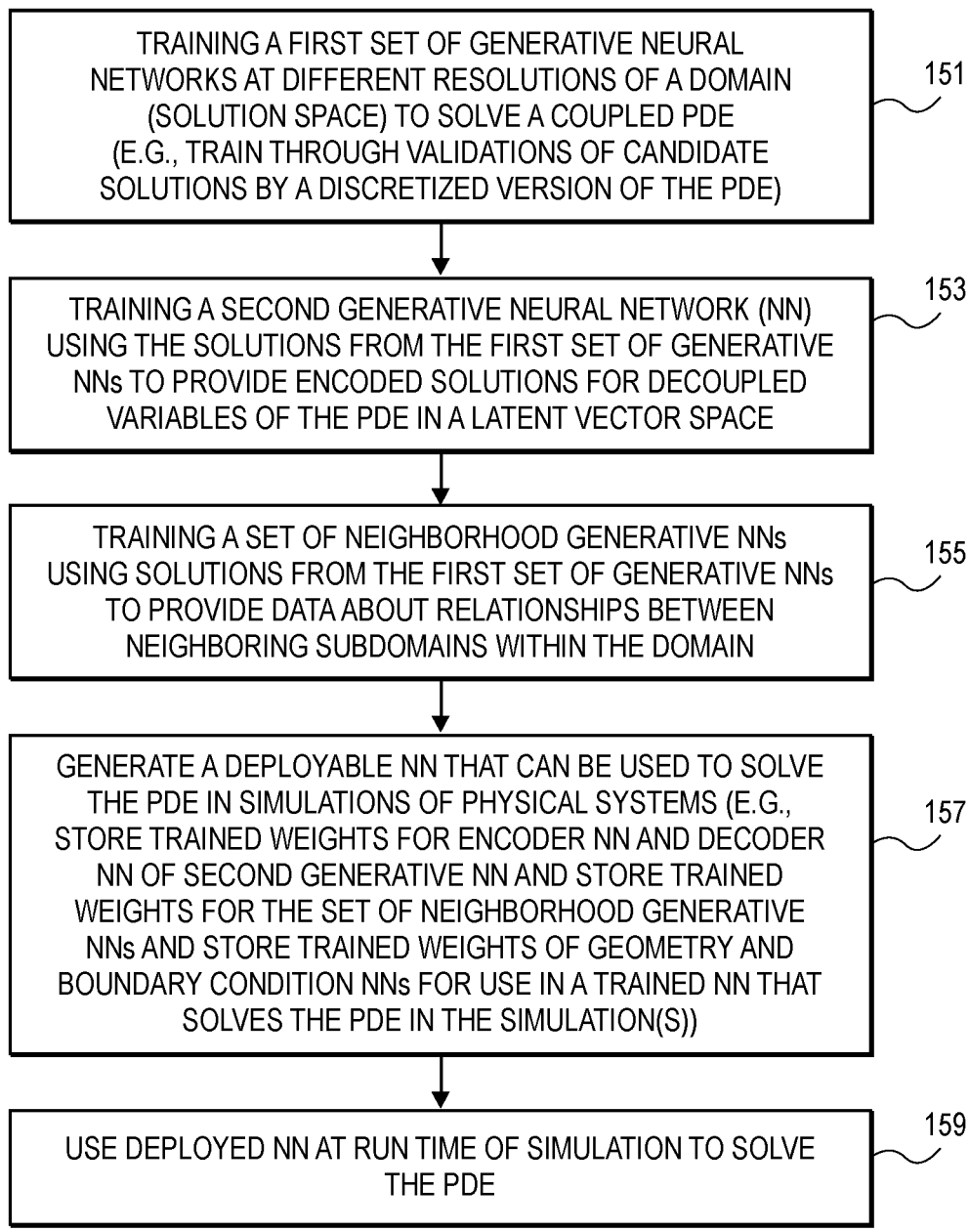
FIG. 2B is a flowchart that shows a method according to one embodiment described herein.
Figure 3A:
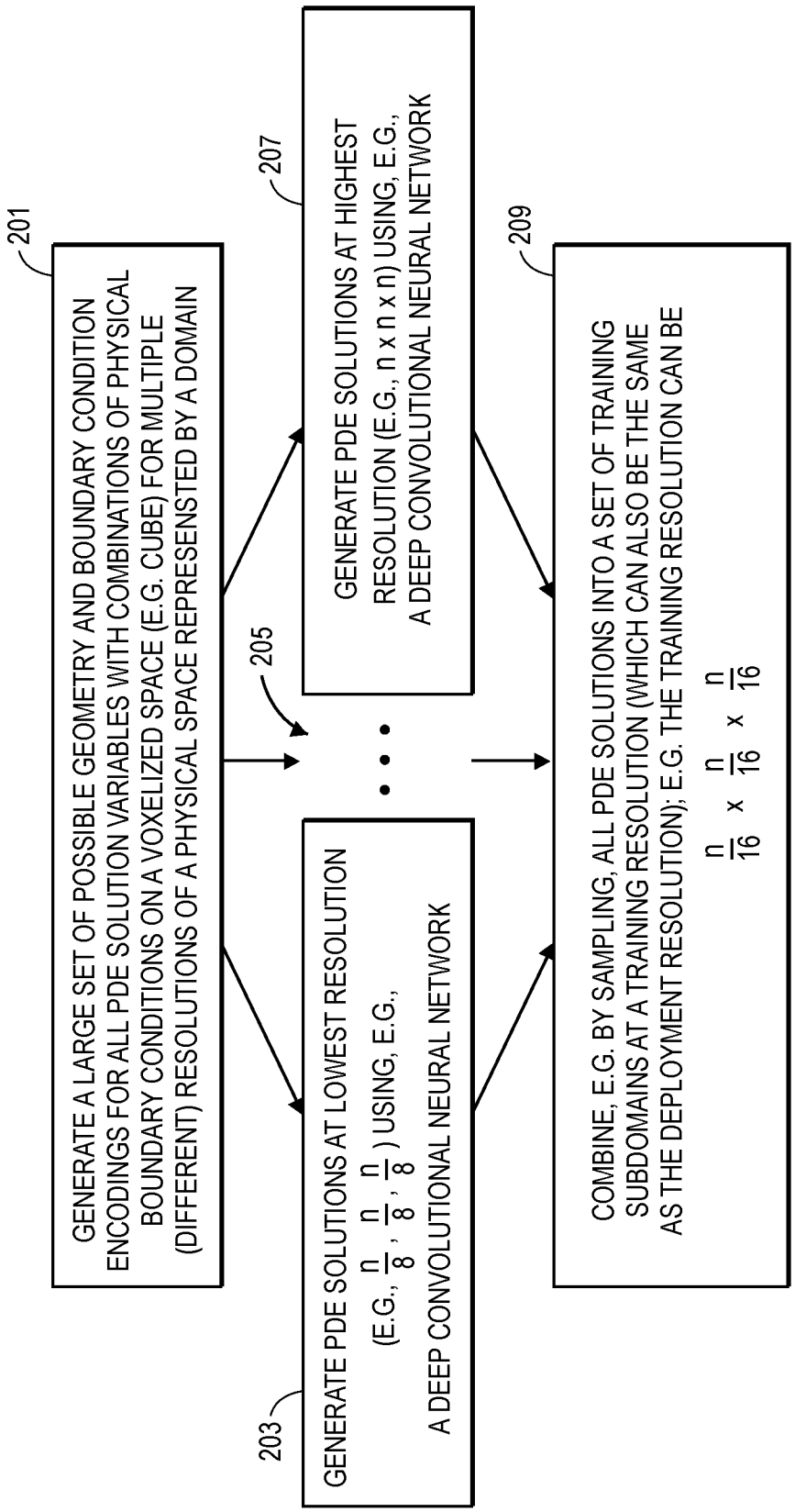
FIG. 3A is a flowchart that illustrates a method for training a first set of generative models, such as generative neural networks, according to one embodiment.
Figure 3B:
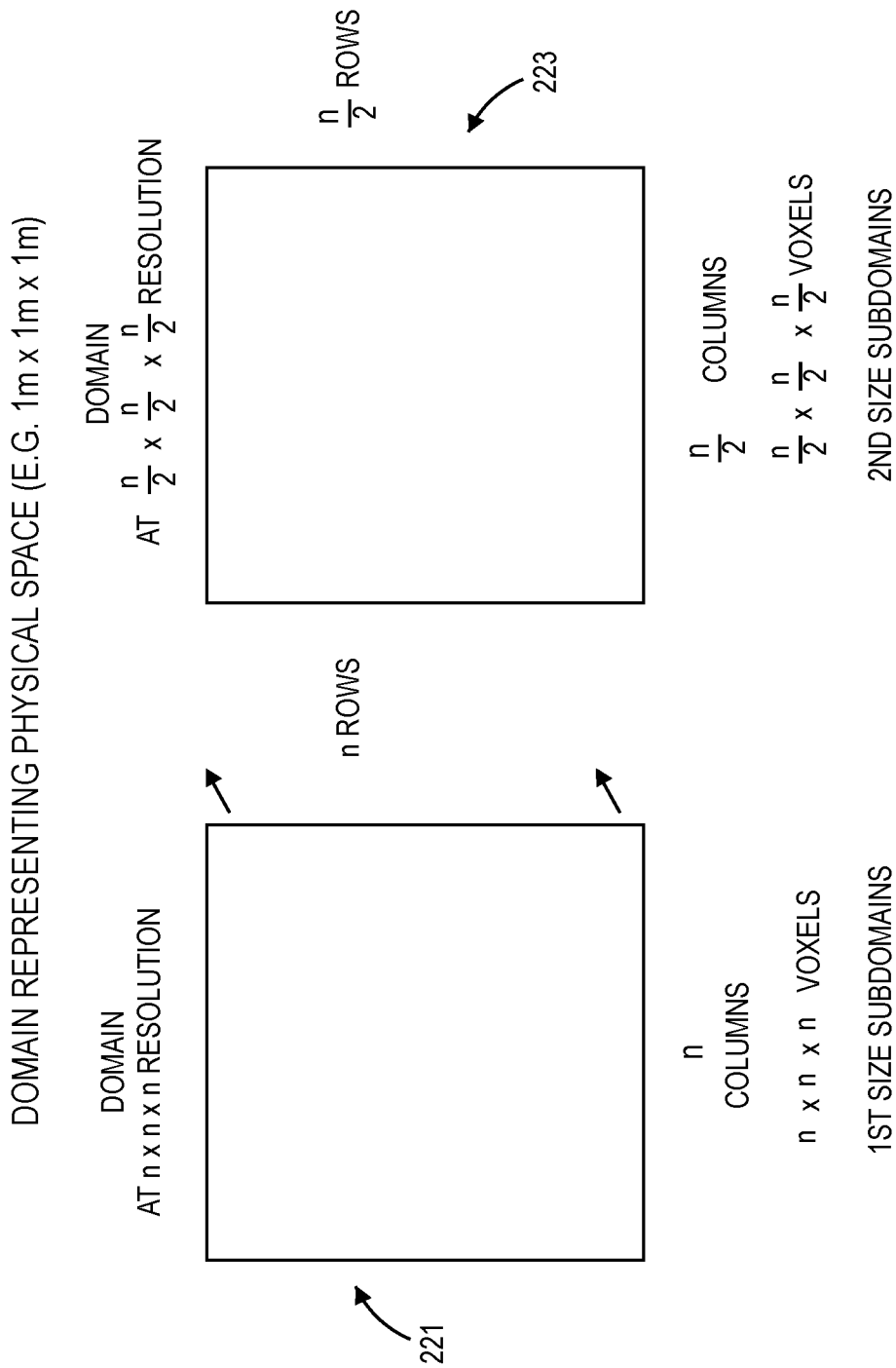
FIG. 3B shows an example of how a domain, which represents a physical space over which solutions will be calculated, can be divided into different sized subdomains which are used when training the first set of generative neural networks.
Figure 3C:
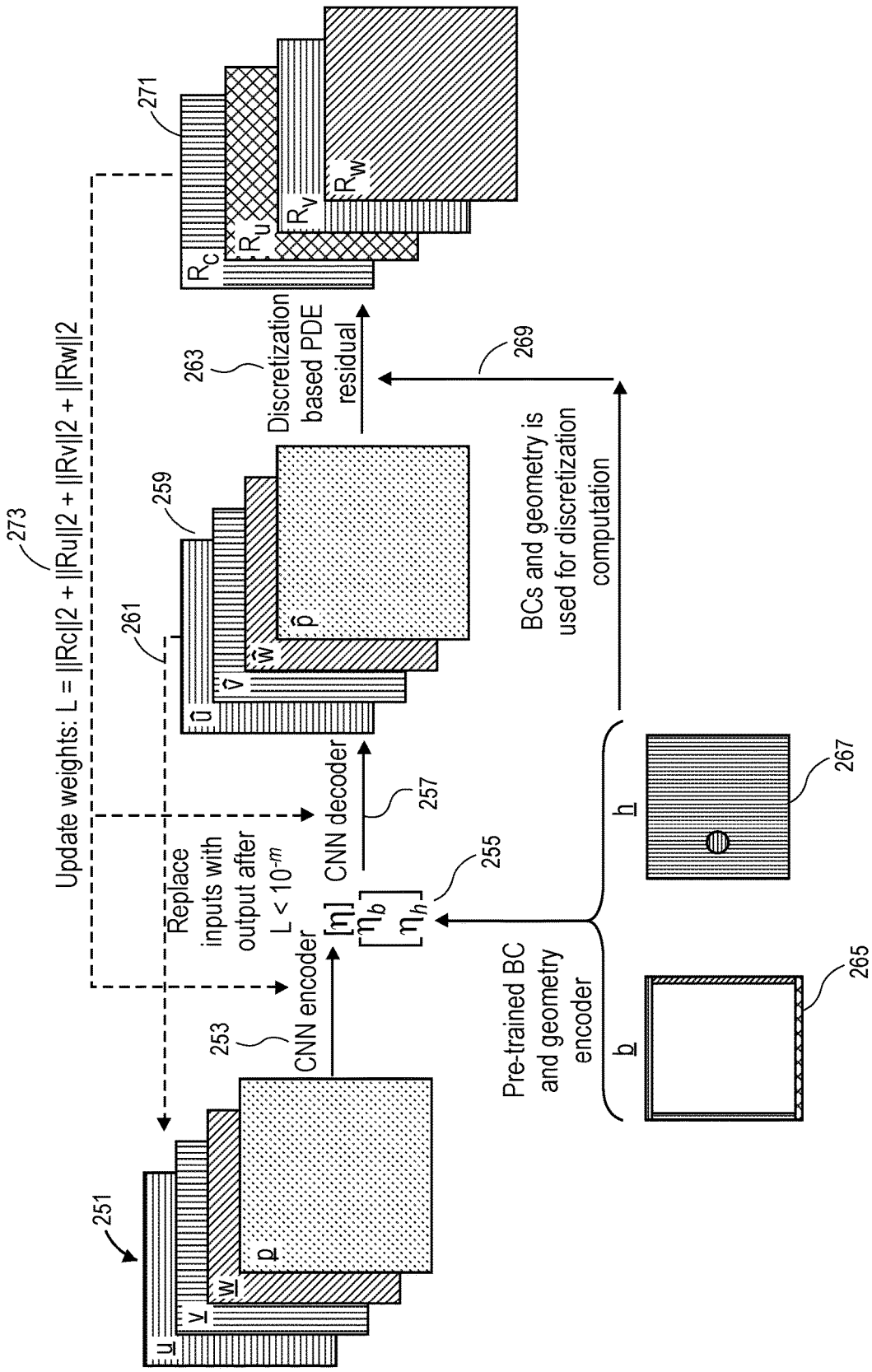
FIG. 3C is a block diagram that illustrates an embodiment of a generative neural network that is part of the first set of generative neural networks.
Figure 4A:
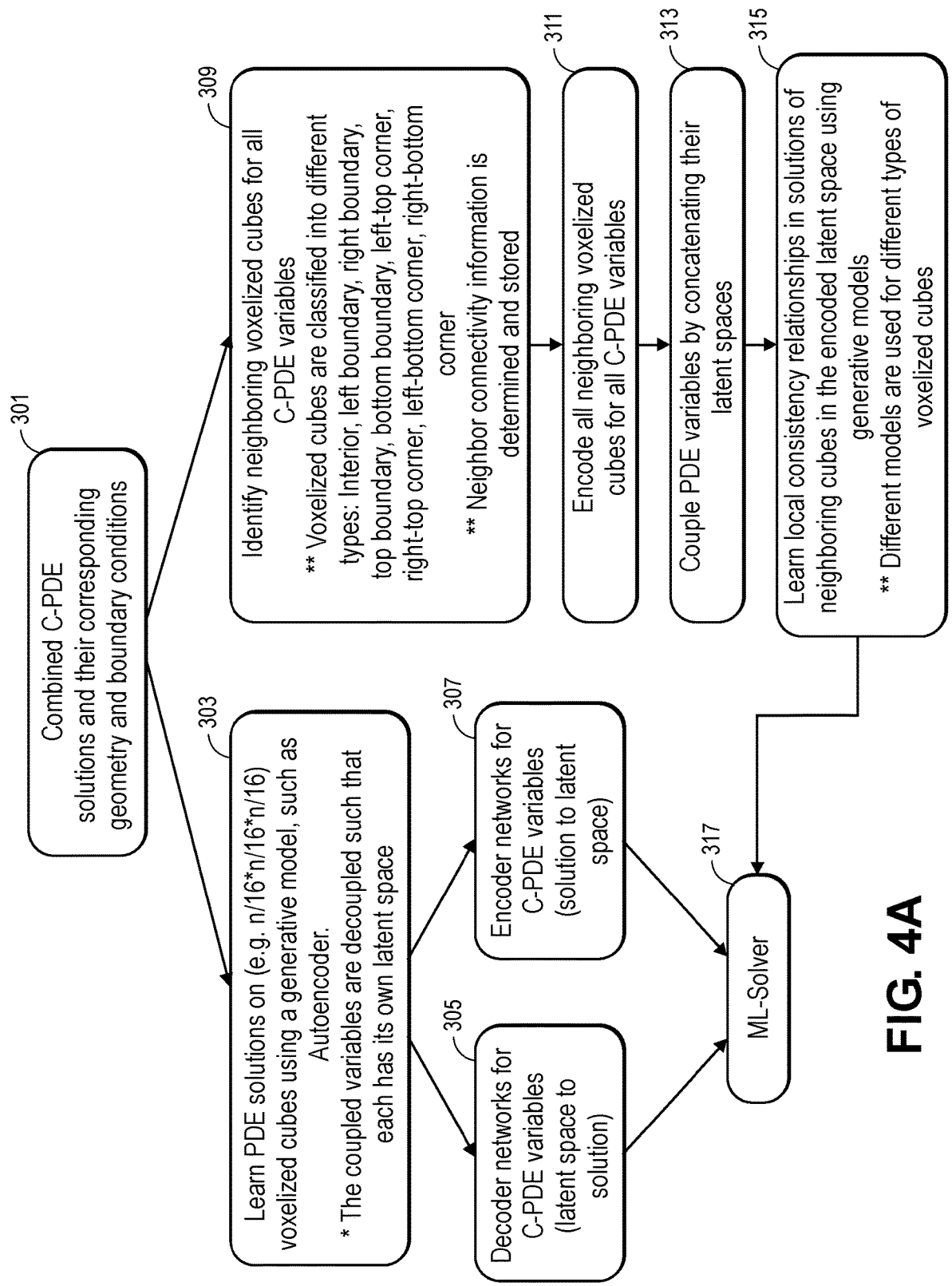
FIG. 4A is a flowchart that illustrates a method for training a second generative model (such as a second generative neural network) and training a set of neighborhood generative models (such as a set of neighborhood generative neural networks) using the results from the first set of generative neural networks.

The system shown in FIG. 2A can be created by the method shown in FIG. 2B to create a solver and then deploy the solver which can then be used in simulations of physical systems. FIG. 2B provides an overview of the flow of processing (for the creation of the solver) in one embodiment. Referring now to FIG. 2B, in operation 151 a first set of generative NNs (or first set of generative models) is trained at different resolutions of a domain, for example by using different sized subdomains of the domain. This is further described below when the method shown in FIG. 3A is described. FIG. 3B, described further below, shows examples of how the first set of generative NNs can be trained at different resolutions of the domain. FIG. 3C, described further below, shows an example of a generative NN that is one of the generative NNs in the first set of generative NNs. In one embodiment, one generative NN in the first set of generative NNs is used for each different resolution as described further below. Referring back to FIG. 2B, in operation 153 the second set of generative NNs (or second set of generative models) is trained using the solutions from the first set of generative NNs; the second set of generative NNs are learning (during the training) on subdomains derived from the solutions generated by the first set of generative NNs. The second set of generative NNs can provide encoded PDE solutions for decoupled variables as latent vectors in a latent vector space, and these latent vectors can be used by the set of neighborhood generative NNs to train, in operation 155 of FIG. 2B, for the locally consistent solutions across subdomain boundaries. FIG. 4A, described further below, shows an example of a method that can be performed by the second set of generative NNs and the set of neighborhood generative NNs, and FIG. 4B, described further below, shows an example of an embodiment of the second set of generative NNs. At the completion of training, a deployable model (e.g., a trained set of NNs) can be created in operation 157 of FIG. 2B. In one embodiment, the deployable set of NNs can be represented by a set of trained weights. In one embodiment, the set of trained weights can include the following: trained weights for each encoder NN and for each decoder NN of the second set of generative NNs; and trained weights for the set of neighborhood generative NNs; and trained weights of the geometry and boundary condition NNs. After a deployable NN has been created in operation 157, it can be used in operation 159.

The following section will describe the first set of generative NNs and their training by referring to FIGS. 3A, 3B and 3C. This first set of generative NNs generates the trained solutions that are trained on by the second set of generative NNs and the neighborhood generative NNs. The first set of generative NNs can begin training by using, in operation 201 of FIG. 3A, a large set of possible geometry and boundary conditions, in an encoded form, for all possible combinations of physical boundary conditions under a PDE for solution variables of the PDE (or set of PDEs). This input set of data can be used over multiple different resolutions, provided by differently sized subdomains of the same domain size (as shown in FIG. 3B), to create a set of solutions for the PDE over the different grid resolutions of the entire domain. This input set of data can be large enough to ensure that PDE solutions are available over a large range of the possible solution space in which simulations may be performed, including a large set of possible geometry and boundary conditions for all variable of the PDE.

After the initial set of data is assembled, training of each generative NN in the first set of generative NNs can be performed in operations 203 and 207 for different resolutions and any other resolution, such as operation 205 for a third resolution. In the example shown in FIG. 3A, there are two operations (203 and 207) for two different resolutions, but in other embodiments, there may be more operations for more resolutions. In one embodiment a separate generative NN in the first set of generative NNs is used for each different resolution, and FIG. 3C shows an example of one generative NNs in the first set of generative NNs. Thus a first generative NN in the first set of generative NNs generates solutions for the PDE at a first resolution over the entire domain, and a second generative NN in the first set of generative NNs generates solutions for the PDE at a second resolution over the entire domain. Each of these separate generative NNs generates solutions in each subdomain at that resolution for the entire domain, and each can be a deep convolutional NN and can be implemented using the techniques described in U.S. patent application Ser. No. 16/827,037, filed Mar. 23, 2020 by Derek Christopher Hill, and this U.S. patent application Ser. No. 16/827,037, filed Mar. 23, 2020 is incorporated herein by reference. The solutions generated by each of these generative NNs are generated by minimizing the L-2 norm of the PDE residuals, which are computed using numerical discretization schemes, as described in U.S. patent application Ser. No. 16/827,037, filed Mar. 23, 2020 by Derek Christopher Hill. In one embodiment, an iterative approach is followed, where the inputs to the generative neural network (e.g., the generative NN shown in FIG. 3C) are replaced with the newly generated solutions, every time the PDE residuals reduce by an order of magnitude. At any given point during the training, the solutions generated are dependent on the solutions from a previous iteration and not the initial random solutions used in the beginning. This allows the network to converge from partially converged solutions to fully converged solutions in an iterative fashion and improves stability and convergence as compared to other Machine Learning methods in this space. At convergence, when the L-2 norm of PDE residuals have dropped to a reasonably low level, the input and output solutions are very similar and effectively turns the network into a conditional autoencoder. It is a conditional autoencoder, since the decoder network is conditioned on the solution encoding as well as the encoding of geometry and boundary. This provides a physical meaning to the reduced dimensional latent space, which can now describe flow solutions at given boundary, geometry or flow conditions. Moreover, the PDE solutions are independent of the spatial dimension and depend only on the solutions at previous iterations.

In one embodiment, an Operation 207 can be performed at an original resolution of the domain (e.g., n by n by n) by a first generative NN in the first set of generative NNs while operation 203 can be performed by a second generative NN in the first set of generative NNs with a resolution based on a subdomain division of the original domain that produces a different sized subdomain relative to the subdomains used in the original resolution. In one embodiment, each of the subdomains at the different resolutions may use, within each subdomain, the same set of voxels (e.g., 8 by 8 by 8 in the case of a cube subdomain) when solving for PDE solutions with the subdomain. In one embodiment, boundary and geometry information are encoded in the network. This information is added in the latent vector space was well as the computational graph for computing the PDE residual. The encodings for geometry and boundary conditions used in the latent vector space are computed using geometry and boundary encoders, such as those shown in FIG. 5C, which are trained a priori for different cases.

After operations 203 and 207 (and any other similar operations at other resolutions of the domain), the training system can combine, in operation 209, the PDE solutions obtained by each generative NN in the first set of generative NNs into a combined set of training solutions sampled across all of the different subdomains in all of the different resolutions used in operations 203 and 207 (and any other similar operations at other resolutions of the domain). The final set of combined results can be expressed in a combined set of subdomains that divides the domain into fewer subdomains than all of the different subdomains used in operations 203 and 207 (and any other similar operations at other resolutions of the domain). For example, if the subdomains used in the training operations 203 and 207 (and any other similar operations at other resolutions of the domain) ranged from n by n by n (nxnxn) to n/8 by n/8 by n/8, then the combined set of subdomains may be at n/16 by n/16 by n/16 in one embodiment. Techniques known in the art for sampling data from different resolutions into a final or combined resolution may be used in operation 209. In one embodiment, the size of the subdomains (e.g., n/16 by n/16 by n/16) used in the combining operation 209 may also be the size of the subdomains used in the process of training the second set of generative NNs and the set of neighborhood generative NNs and may also be the size used by the deployed NNs used at run time by simulations that use the methods described herein. The combining of the solutions from different resolutions (e.g., different subdomain sizes) over the same domain ensures both coarse and fine grain solutions are captured in the final combined set of subdomains that are used by the second set of generative NNs and by the set of neighborhood generative NNs. Moreover, this final combined set includes the information about neighboring subdomains such that each neighbor can be exactly determined and is useful in training the set of neighborhood generative NNs.

FIG. 3B shows an example of how different divisions or partitions of a domain can achieve different resolutions over the entire domain. A division 221 of the domain shown in FIG. 3B results in a resolution of n by n by n, with n by n by n voxels, with each voxel being represented by a subdomain; within each subdomain, there can be a further subdivision into 8 by 8 by 8 point voxels (or other subdivisions within each subdomain). Each of these subdomains can have a first size. Viewing a plane in this division 221 of the domain, there are n rows and n columns created by division 221. A division 223 of the domain shown in FIG. 3B results in a resolution of n/2 by n/2 by n/2, with n/2 by n/2 by n/2 voxels, with each voxel being represented by a subdomain; within each subdomain, there can be a subdivision into 8 by 8 by 8 point voxels (or other subdivisions within each subdomain). Each of these subdomains can have a second size which will be larger than the first size. Viewing a plane in this division 223 of the domain, there are n/2 rows and n/2 columns created by this division 223. These different divisions or partitions of a domain can create the different sets of subdomains such as a first set of subdomains that are processed by a first generative NN in the first set of generative NNs (e.g., in operation 203) and a second set of subdomains that are processed by a second generative NN in the set of generative NNs (e.g., in operation 207).

An example of one generative NN used in the first set of generative NNs is shown in FIG. 3C. This example is similar to the generative NNs described in U.S. patent application Ser. No. 16/827,037, filed Mar. 23, 2020 by Derek Christopher Hill. This one generative NN is used to compute solutions for one of the resolutions (e.g., one of the sizes of subdomains used in operation 203, for example). This generative NN includes an a convolutional NN encoder 253 that receives solution values 251 (such as an initial random set of solution values or other solutions values such as updated solutions 261). This encoder 253 is trained using update weights 273 during the training process. This encoder produces latent vectors that encode the solution (e.g., solution values 251) in a latent vector space, and latent vectors from pretrained boundary condition and geometry encoders 265 and 267 respectively are combined (e.g., concatenated) with the encoded solution values to produce the latent vector 255 that is input to the convolutional NN decoder 257. The encodings from the pretrained boundary condition and geometry encoders 265 and 267 enrich the latent vectors. The decoder 257 produces an output that is an updated set of solution values 259; as previously described, this updated set of solution values can be used to replace (arrow 261) the solution values 251 (e.g., every time the PDE residuals reduce by an order of magnitude). A discriminator 263 uses the updated set of solution values 259 and the boundary condition and geometry discretization input 269 to compute residuals 271 that are used, in a back propagation process, to update the weights in the encoder 253 and the decoder 257. In one embodiment, the discriminator 263 can use a discretized version of the PDE as the discriminator to evaluate the candidate solutions during the convergence process; further information about the operation of such a discriminator and a convergence process is provided in U.S. patent application Ser. No. 16/827,037, filed Mar. 23, 2020 by Derek Christopher Hill. The generative NN shown in FIG. 3C continues improving the solutions to the PDE until a convergence criterion is satisfied, and these solutions can then be provided as inputs to the second set of generative NNs and the set of neighborhood NNs.

Figure 4B:
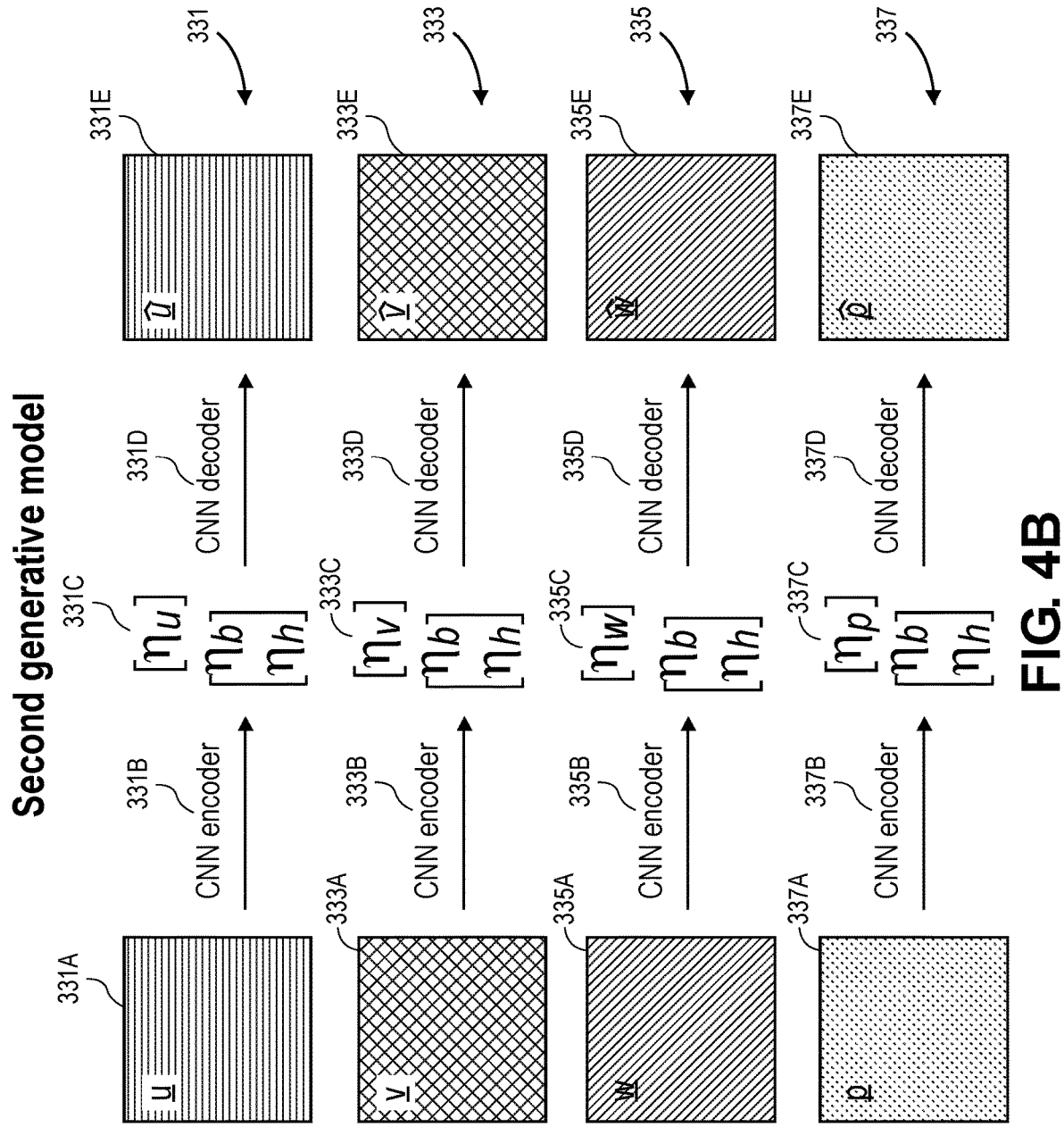
FIG. 4B is a block diagram that illustrates an embodiment of a second generative neural network that is trained using the method shown in FIG. 4A.

The following section will describe the second set of generative NNs and the set of neighborhood generative NNs while referring to FIGS. 4A, 4B, 5A, and 5B. The solutions from the first set of generative NNs can be provided as inputs to train the second set of generative NNs and the set of neighborhood generative NNs. Thus, the output from operation 209 (in FIG. 3A) is used as the input in operation 301 of FIG. 4A which shows a method of training the second set of generative NNs and training the set of neighborhood generative NNs using the data set in the output from operation 209. The training inputs to the second set of generative NNs and the set of neighborhood generative NNs are not, in one embodiment, solutions on an entire domain but rather are solutions on subdomains which are part of the entire domain. For example: a domain with a resolution of 32*32 can have 16, 8*8 subdomains. This means that 1, 32*32 solution can be divided into 16, 8*8 solutions. So, the second generative model can take all 16 solutions as different training samples. Similarly, the neighborhood network can take 4 solutions and their neighbors to learn the interior neighborhood network, 4 to learn the corner and 8 to learn the boundary. In operation 303, the second set of generative NNs is trained. The second set of generative NNs can be configured as a conditional encoder-decoder type of NN, and thus each generative NN in the second set of generative NNs includes, as shown in FIG. 4B, an encoder NN that encodes PDE solutions into latent vectors in a latent vector space and a decoder NN that decodes the latent vectors, received from the encoder NN back into PDE solutions for the variables in the PDE. After the encoder NNs in the second set of generative NNs have been trained, these trained encoder NNs 305 shown in FIG. 4A can be stored as part of a solver such as the ML (machine learning) solver 317. After the decoder NNs in the second set of generative NNs have been trained, these trained decoder NNs 307 shown in FIG. 4A can be stored as part of the solver 317. These encoder and decoder NNs (in the second set of generative NNs) are conditioned on the geometry and boundary conditions encoded in the PDE solutions from the first set of generative NNs (through the use of the boundary condition and geometry discretization input 269 when the first set of generative NNs are trained). Each subdomain, in one embodiment, has a different boundary and geometry encodings. For example, if a square domain with resolution 32*32 has a circle in the center and a system divides such a domain into 16, 8*8 subdomains, there are certain subdomains which will include parts of that circle while others do not. So, all the subdomains are encoded using the pretrained boundary and geometry encoders for the geometry and the boundary conditions. These encodings are not necessarily known from the first generative model, but can be computed using the pretrained geometry and boundary encoders. In a coupled PDE system (such as a set of Navier Stokes equations), there can be multiple solutions that are highly dependent on each other; in such scenarios, it can be difficult to establish a common latent vector space for all of the coupled variables because a common latent vector space can hamper the accuracy of machine learning networks. To enhance learning in the second set of generative NNs, the coupled variables can be decoupled and trained in separate generative NNs such that each variable has a unique and distinct encoding of its solution; this is shown in FIG. 4B.

FIG. 4B shows an example of a second set of generative NNs, with a separate generative NN for each variable (there are four variables: u, v, w and p in this example for a set of Navier Stokes equations) to provide for decoupled variables. As shown in FIG. 4B, the second set of generative NNs includes four separate generative NNs 331, 333, 335 and 337. The generative NN 331 includes an encoder NN 331B that receives solutions 331A for the variable u and encodes those solutions into latent vectors 331C (to which are appended the encoded geometry and boundary conditions as shown in FIG. 4B), and the generative NN 331 also includes a decoder NN 331D that receives the encoded solutions (in the form of latent vectors 331C) and decodes these solutions to provides solutions 331E at the output of the decoder NN 331D. The generative NN 333 includes an encoder NN 333B that receives solutions 333A for the variable v and encodes those solutions into latent vectors 333C (to which are appended the encoded geometry and boundary conditions as shown in FIG. 4B), and the generative NN 333 also includes a decoder NN 333D that receives the encoded solutions (in the form of latent vectors 333C) and decodes these solutions to provides solutions 333E at the output of the decoder NN 333D. The generative NN 335 includes an encoder NN 335B that receives solutions 335A for the variable w and encodes those solutions into latent vectors 335C (to which are appended the encoded geometry and boundary conditions as shown in FIG. 4B), and the generative NN 335 also includes a decoder NN 335D that receives the encoded solutions (in the form of latent vectors 335C) and decodes these solutions to provides solutions 335E at the output of the decoder NN 335D. The generative NN 337 includes an encoder NN 337B that receives solutions 337A for the variable p and encodes those solutions into latent vectors 337C (to which are appended the encoded geometry and boundary conditions as shown in FIG. 4B), and the generative NN 337 also includes a decoder NN 337D that receives the encoded solutions (in the form of latent vectors 337C) and decodes these solutions to provides solutions 337E at the output of the decoder NN 337D. Each of the four variables has its own representation in the encoded latent vector space, and thus they are decoupled within this second set of generative NNs. The goal of the second set of generative NNs is to learn the solutions for each variable and not solve them because the inputs to the second set of generative NNs are the solutions for the variable of the PDEs from the first set of generative NNs (e.g., the output from operation 209 in FIG. 3A); thus, PDE discretization losses are not required in the process of training the second set of generative NNs. The latent vectors (e.g., latent vectors 337C) in the latent vector space are conditioned on the corresponding boundary condition and geometry encodings, and these encodings are from pretrained boundary condition and geometry encoder (such as the encoders shown in FIG. 5C).

Figure 5A:
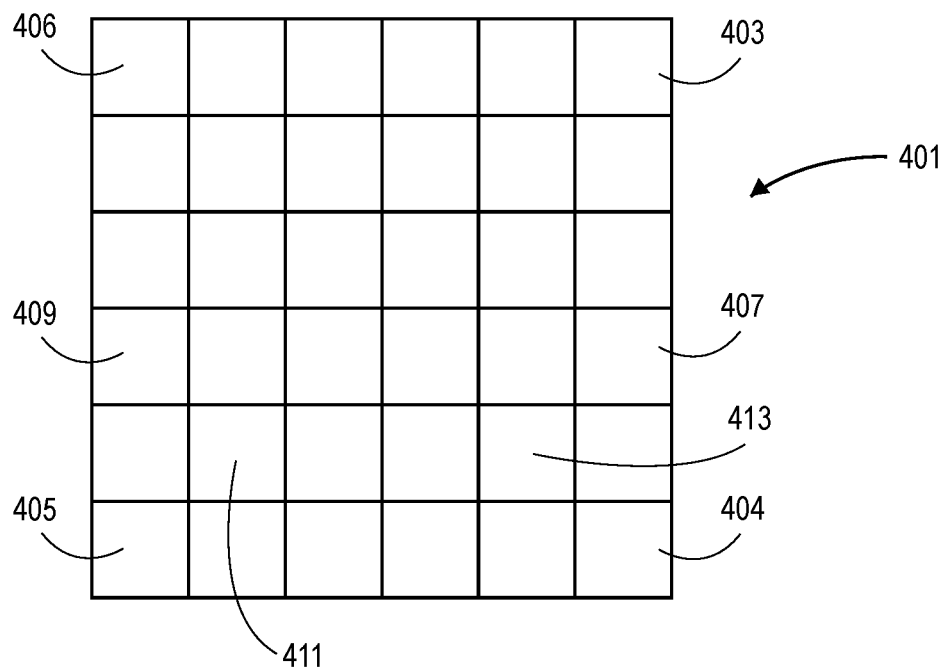
FIG. 5A shows an example of how different subdomains in a domain can be classified based on their positions within the domain according to one embodiment.
Figure 5B:
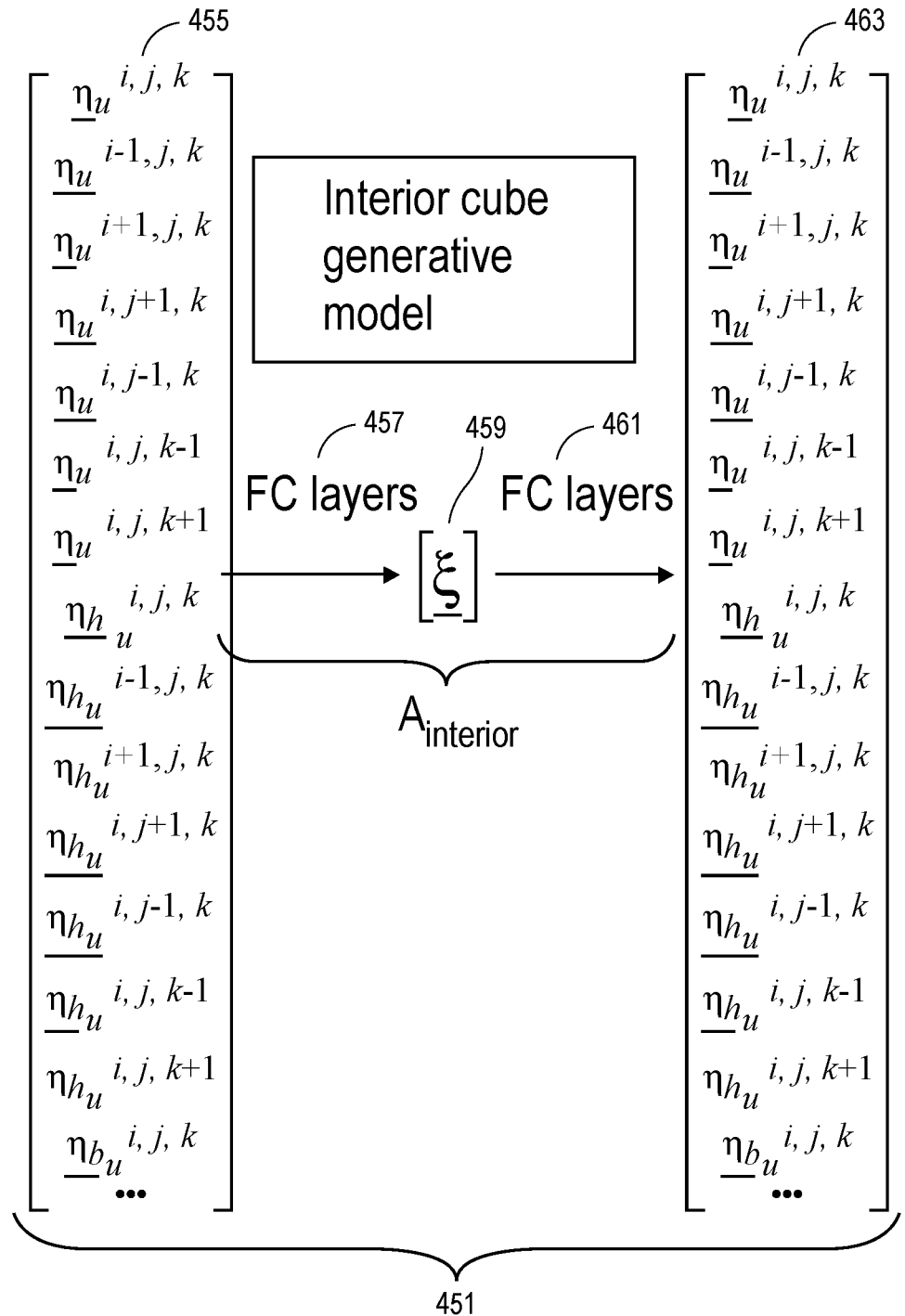
FIG. 5B (parts 1 & 2) show how the set of neighborhood generative neural networks can concatenate latent vectors of neighboring solutions to couple the variables of the PDE.
Figure 5B:
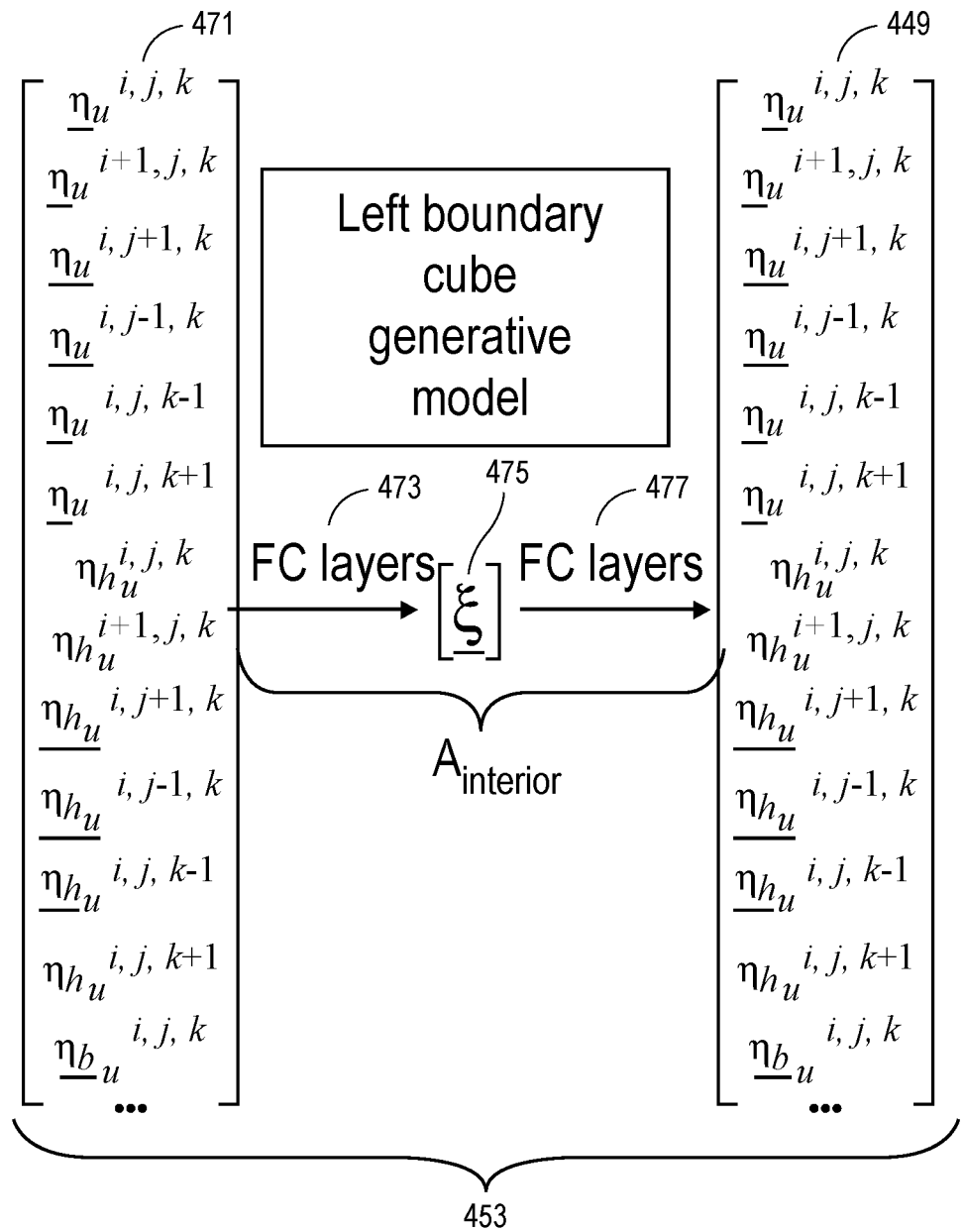

Referring back to FIG. 4A, the training of the set of neighborhood generative NNs begins in operation 309. In operation 309, neighboring subdomains are identified so that, for each subdomain, all of its neighbors are identified and classified based on their position within the domain. In one embodiment, each of the subdomains can be classified as one of 3 different types: a corner subdomain, an interior subdomain or a boundary subdomain. FIG. 5A shows an example of such a classification system. The domain 401 in FIG. 5A includes 36 subdomains (6 by 6) in a plane, and these subdomains include subdomains 403, 404, 405, 406, 407, 409, 411, and 413. In a 3 type classification system, subdomains 403, 404, 405, and 406 are classified as corner subdomains; subdomains 411 and 413 are classified as interior subdomains; and subdomains 407 and 409 are classified as boundary subdomains. The example in operation 309 uses at least 9 different types of classes: interior, left boundary, right boundary, top boundary, bottom boundary, left top corner, right top corner, left bottom corner, and right bottom corner. Using one of these classification schemes, operation 309 determines neighborhood connectivity information and stores this information. A separate neighborhood generative NN is trained for each type of subdomain and each such separate neighborhood generative NN is trained in the encoded, latent vector space in which PDE solutions are encoded in the latent vector space. For example, a left top corner neighborhood generative NN is used to train using training data from subdomains that are classified as left top corner subdomains. In operation 311, an encoder NN of the set of neighborhood generative NNs encodes the neighborhood information with the encoded solutions from the trained decoder NNs 307 shown in FIG. 4A for the corresponding subdomains. For example, an encoded solution from the trained encoders NN 307 for a left top corner subdomain is encoded with left top corner neighborhood information by an encoder NN that is part of the left top corner neighborhood generative NN. The boundary and geometry conditions are also encoded on each subdomain using the pretrained boundary and geometry conditions encoders. The solution, geometry and boundary encodings of all neighboring subdomains are stacked together in one embodiment since a solver, such as solver 317, is solving a coupled PDE system, where the solution, boundary and geometry on each subdomain depends on the solution of all the coupled variables and the boundary and geometry on that subdomain as well as the neighboring subdomains. In the second set of generative NNs, the solution spaces of these coupled variables were decoupled and we need to establish that coupling again for the solver 317 to operate. The coupling is established in operation 313 by concatenating all the solution encodings of different coupled variables from all neighboring subdomains. This is shown in FIG. 5B which will be described further below. Then, in operation 315, the neighborhood generative model (e.g., the set of neighborhood generative NNs) learns local consistency of solution among neighboring subdomains by learning the encodings of solutions of each PDE variable, geometry and boundary on those neighboring sub-domains. The result of this training in operation 315 provides the trained weights for the set of neighborhood generative NNs to the solver 317 which can then be deployed.

FIG. 5B shows an example of two neighborhood generative NNs 451 and 453 that are part of a set of neighborhood generative NNs in one embodiment. Each of the neighborhood generative NNs in the set can be an autoencoder type network that includes an encoder NN and a decoder NN. The encoder NN, in the autoencoder, receives a solution input and encodes it as a latent vector (in a latent vector space), and the decoder NN, in the autoencoder, decodes the latent vector into solution values at the output of the decoder NN. Latent vectors of a given subdomain and its neighboring subdomains are learned using these autoencoder type networks. The neighborhood generative NN 451 is an autoencoder NN for an interior subdomain that includes encoder 457 which receives encoder inputs 455 that includes concatenated latent vectors from, for example, the encoder NN 307 in FIG. 4A. The encoder 457 generates a latent vector 459 that is supplied as an input to the decoder 461 of the neighborhood generative NN 451; the decoder 461 decodes the latent vector 459 back into concatenated latent vectors 463. The latent vector 459 can be perceived as a second order encoding of the PDE solutions on given neighboring subdomains. The neighborhood generative NN 453 is an autoencoder NN for a left boundary subdomain that includes encoder 473 which receives encoder inputs 471 that includes concatenated latent vectors from, for example, the encoder NN 307 in FIG. 4A. The encoder 473 generates a latent vector 475 that is supplied as an input to the decoder 477 of the neighborhood generative NN 453; the decoder 477 decodes the latent vector 475 back into concatenated latent vectors 449. The latent vectors of a given subdomain and its neighboring subdomains are learned using the appropriate autoencoder (based on the classification of the subdomain). The coupling of the variables of the PDE(s) is established by concatenating the latent vectors, as shown in FIG. 5B, of neighboring solutions of all coupled variables as well was their geometry and boundary encodings.

Figure 5C:
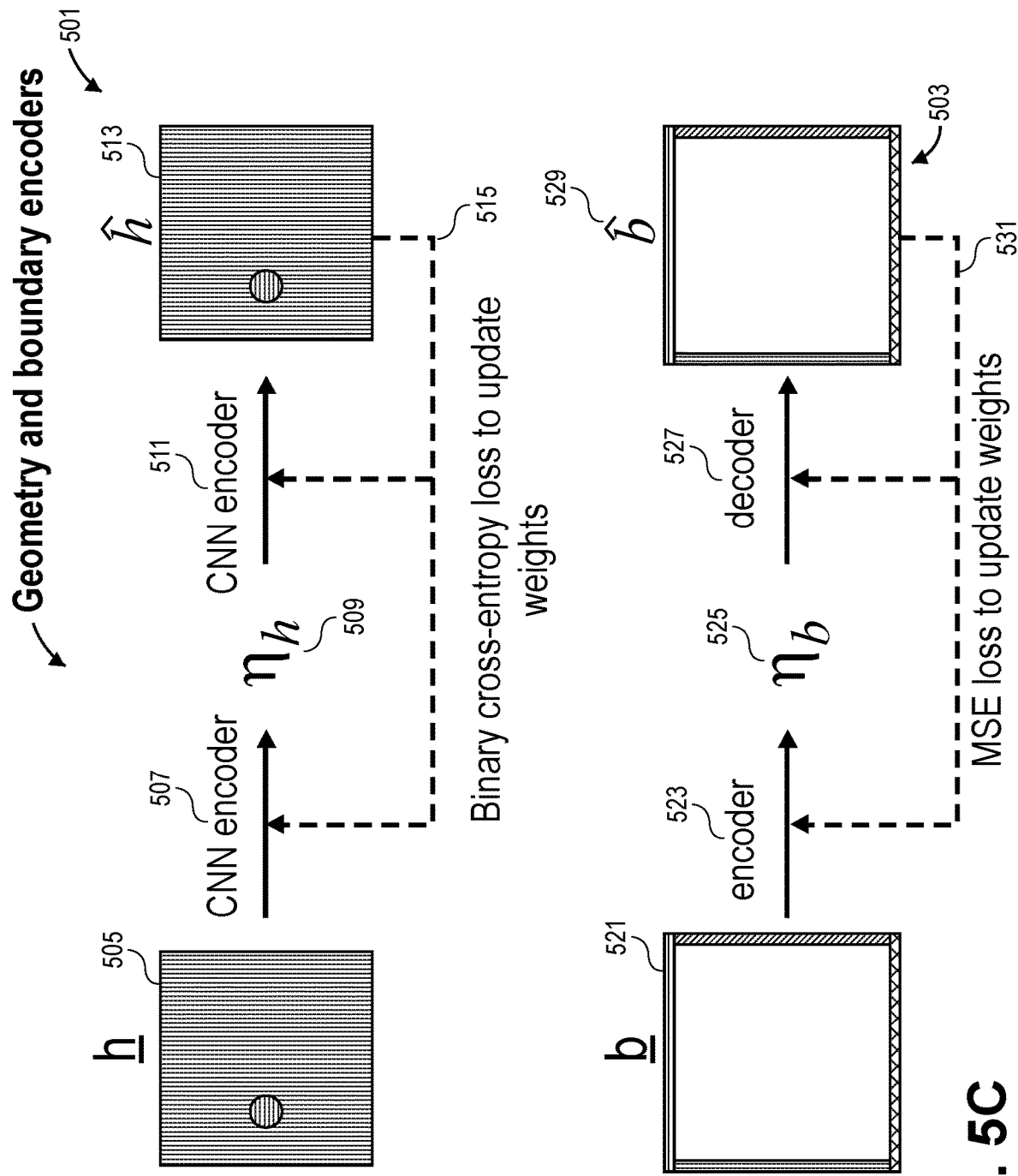
FIG. 5C is a block diagram that shows embodiments of the geometry and boundary encoder networks that are used in the embodiments described herein.

FIG. 5C shows an example of a set of boundary condition and geometry encoders that are used in the training of the first set of generative NNs and in the training of the second set of generative NNs. These encoders are pretrained, in one embodiment, with a large set of all possible boundary conditions and geometry conditions that are expected to be seen when a solver is attempting to solve a set of one or more PDEs during a simulation. In the case of the geometry NN 501, the geometry can be described as a level set, where the voxels inside the geometry are represented as 0 and outside as 1. The level sets for primitive geometries of different shape, size and orientation can be learned using a generative encoder-decoder network and represented in a lower-dimensional space. An example of the geometry autoencoder is shown in FIG. 5C. In this example, the encoder 507 and decoder 511 networks are CNN-based (convolutional NN) and a binary cross-entropy loss function is employed to update the weights of the networks 507 and 511. An input training set of geometries 505 can be applied to the encoder 507 which can generate a latent vector 509, and the decoder 511 generates outputs 513 based upon the latent vector. Level sets of different geometries can be generated by parsing through the latent space vector of a trained geometry encoder and used to parameterize a solver such as solver 317.

A separate boundary condition autoencoder is used to represent different boundary conditions, and the boundary condition NN 503, shown in FIG. 5C, is an example of such autoencoder. The boundary condition NN 503 can use a generative encoder & decoder type of neural network with different types of network architectures depending on the desired result. The boundary condition NN 503 includes an encoder 523 that encodes boundary condition inputs 521 and produces a boundary condition encoding 525 based on those inputs; the boundary condition NN 503 also includes a decoder 527 that decodes the boundary condition encoding 525 to produce the output 529 that is used to back propagate updated weights 531 to cause the boundary condition NN to be trained. In one embodiment, the boundary condition encoder is only required if the boundary conditions are spatially or temporally varying; if the boundary conditions are varying, then a boundary condition NN can be trained. Moreover, the boundary condition encoding can be manually designed if there are constant boundary conditions on each boundary.

Figure 6:
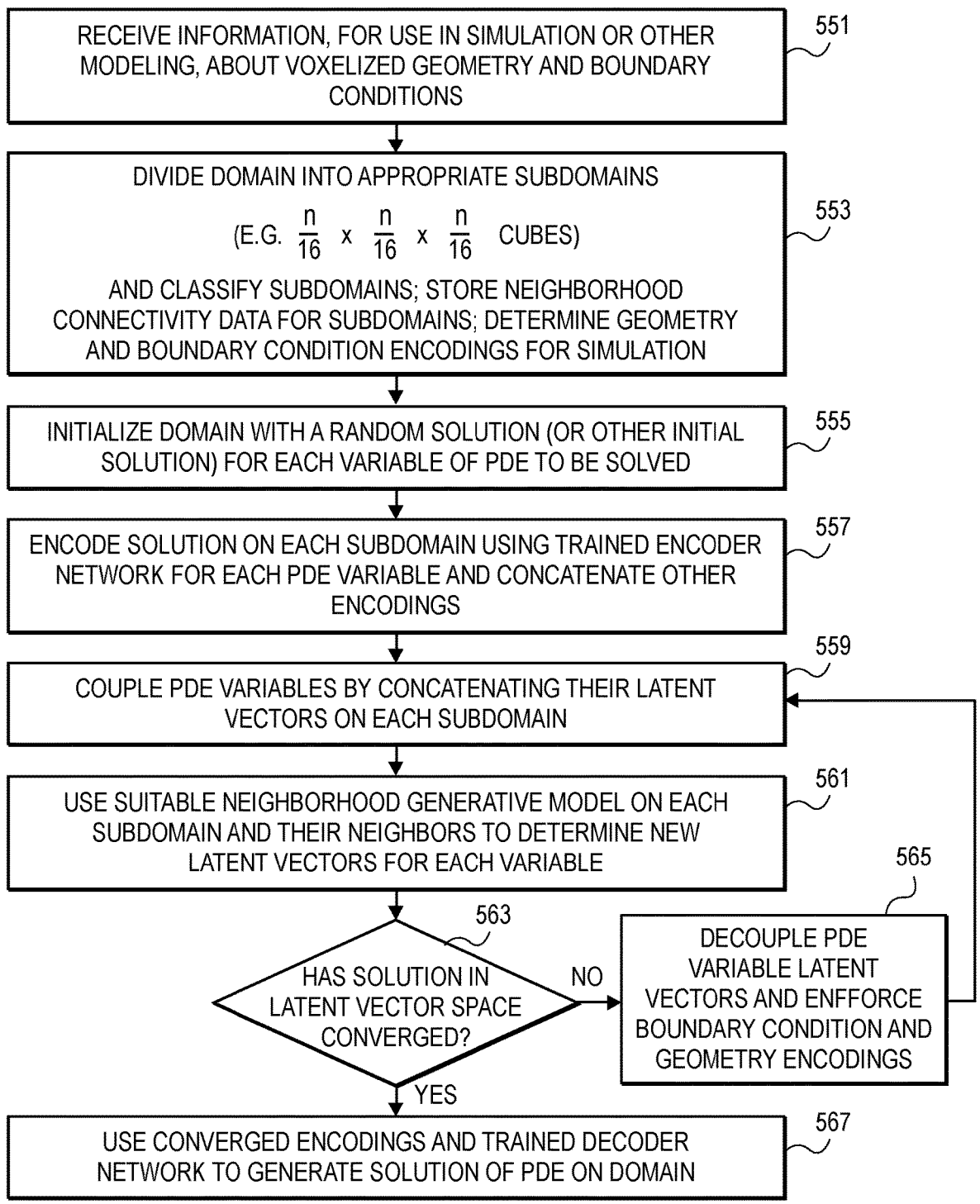
FIG. 6 is a flowchart that illustrates a method that can be performed by a trained solver according to an embodiment.

At the completion of training, a deployable model (e.g., a trained set of NNs) can be created in operation 157 of FIG. 2B to produce a solver, such as the solver 317. In one embodiment, the deployable set of NNs can be represented by a set of trained weights that are produced during the training process. In one embodiment, the set of trained weights can include the following: trained weights for each encoder NN and for each decoder NN of the second set of generative NNs; and trained weights for the set of neighborhood generative NNs; and trained weights of the geometry and boundary condition NNs. After a deployable NN has been created, it can be used in the method shown in FIG. 6. The method in FIG. 6 can begin in operation 551. In operation 551, a solver (such as the solver 317) receives information for use in simulation or other modeling about geometry and boundary conditions. Then in operation 553, the solver can divide a domain which represents the entire solution space into appropriate subdomains, which can be the same size of subdomains (e.g., n/16 by n/16 by n/16) that were used to train the second set of generative neural networks and the set of neighborhood generative neural networks. These subdomains can be classified in operation 553. Further, in operation 553, the solver can store neighborhood connectivity data for the subdomains and determine the geometry and boundary condition encodings for the simulation. Then in operation 555, the solver can initialize the domain with a random solution, or other initial solution, for each variable of the PDE to be solved. Then in operation 557, the solver can encode the solution on each subdomain using the trained encoder network for each PDE variable (from the trained set of second generative NNs) and concatenate other encodings. Then in operation 559, the solver can couple the PDE variables by concatenating their latent vectors on each subdomain as well as its neighbors. In operation 561, the solver can use suitable neighborhood generative models on each subdomain and their neighbors to determine new latent vectors for each variable. In operation 563, the solver can determine whether or not the solution in the latent vector space has converged based upon one or more convergence criteria. For example, the convergence criteria can be based upon a difference between consecutive latent vectors produced during the simulation; when that difference reaches a desired small number, the convergence criteria can be considered to be satisfied in one embodiment. If the solution has not converged, processing proceeds to operation 565. In operation 565, the PDE variable latent vectors are decoupled and boundary conditions and geometry conditions are enforced based upon the boundary condition and geometry encodings and processing returns to operation 559 to repeat the process (in operations 559, 561, 563 and 565) until the solution in the latent vector space converges. When it does converge, processing proceeds to operation 567. In operation 567, the converged latent vectors are decoded using the trained decoder network from the second set of generative NNs to generate a solution of the PDE on the domain.

Figure 7:
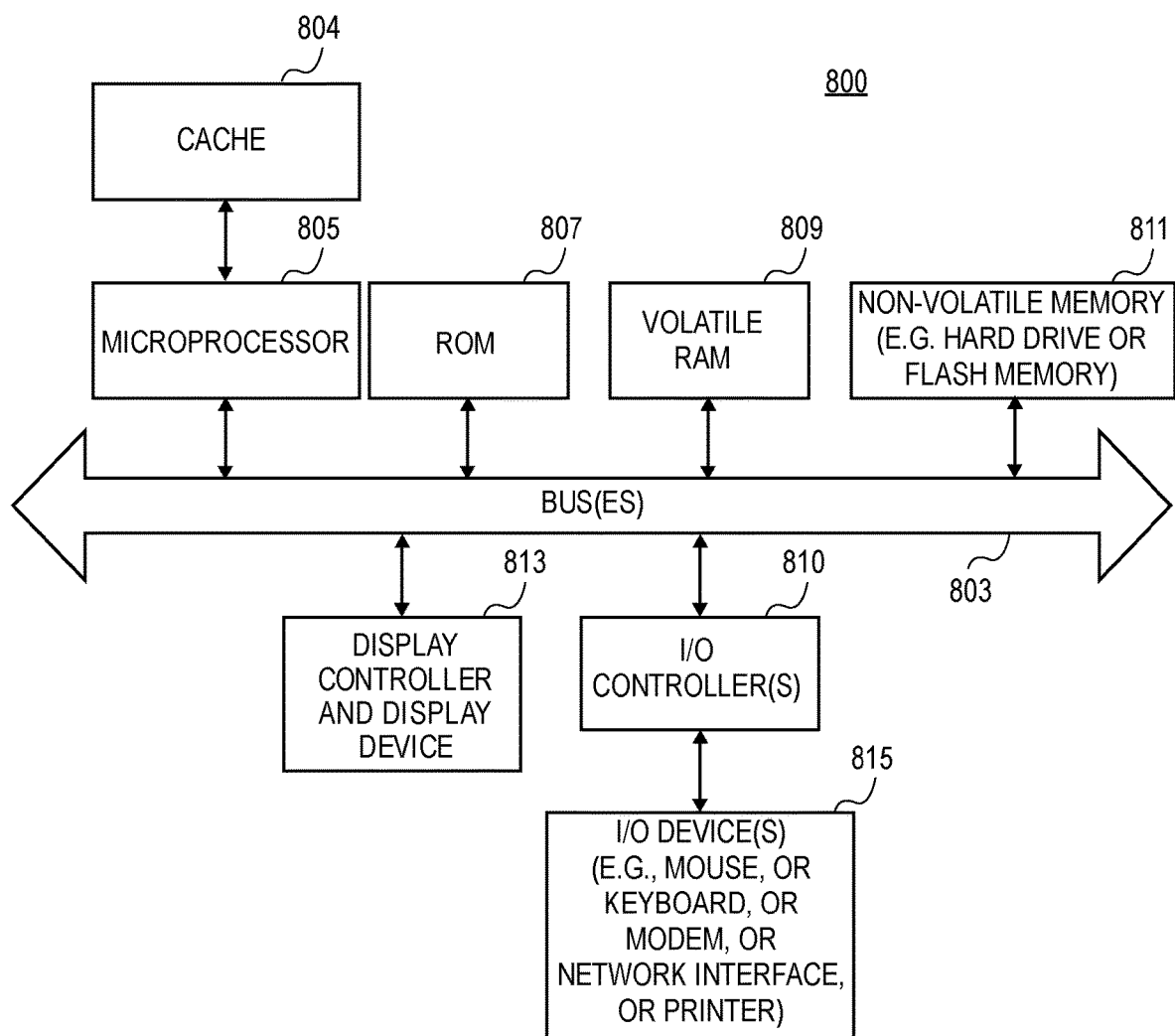
FIG. 7 is a block diagram that shows an example of a data processing system that can be used as a training system in one embodiment or as solver in another embodiment or both.

FIG. 7 shows one example of a data processing system 800, which may be used with one embodiment. For example, the system 800 may be implemented to provide a training system or a solver or device that performs the method of FIG. 2A or 2b or 6. Note that while FIG. 7 illustrates various components of a device, it is not intended to represent any particular architecture or manner of interconnecting the components as such details are not germane to the disclosure. It will also be appreciated that network computers and other data processing systems or other consumer electronic devices, which have fewer components or perhaps more components, may also be used with embodiments of the disclosure.

As shown in FIG. 7, the device 800, which is a form of a data processing system, includes a bus 803 which is coupled to a microprocessor(s) 805 and a ROM (Read Only Memory) 807 and volatile RAM 809 and a non-volatile memory 811. The microprocessor(s) 805 may retrieve the instructions from the memories 807, 809, 811 and execute the instructions to perform operations described above. The microprocessor(s) 805 may contain one or more processing cores. The bus 803 interconnects these various components together and also interconnects these components 805, 807, 809, and 811 to a display controller and display device 813 and to peripheral devices such as input/output (I/O) devices 815 which may be touchscreens, mice, keyboards, modems, network interfaces, printers and other devices which are well known in the art. Typically, the input/output devices 815 are coupled to the system through input/output controllers 810. The volatile RAM (Random Access Memory) 809 is typically implemented as dynamic RAM (DRAM), which requires power continually in order to refresh or maintain the data in the memory.

The non-volatile memory 811 is typically a magnetic hard drive or a magnetic optical drive or an optical drive or a DVD RAM or a flash memory or other types of memory systems, which maintain data (e.g., large amounts of data) even after power is removed from the system. Typically, the non-volatile memory 811 will also be a random access memory although this is not required. While FIG. 7 shows that the non-volatile memory 811 is a local device coupled directly to the rest of the components in the data processing system, it will be appreciated that embodiments of the disclosure may utilize a non-volatile memory which is remote from the system, such as a network storage device which is coupled to the data processing system through a network interface such as a modem, an Ethernet interface or a wireless network. The bus 803 may include one or more buses connected to each other through various bridges, controllers and/or adapters as is well known in the art.

Portions of what was described above may be implemented with logic circuitry such as a dedicated logic circuit or with a microcontroller or other form of processing core that executes program code instructions. Thus processes taught by the discussion above may be performed with program code such as machine-executable instructions that cause a machine that executes these instructions to perform certain functions. In this context, a "machine" may be a machine that converts intermediate form (or "abstract") instructions into processor specific instructions (e.g., an abstract execution environment such as a "virtual machine" (e.g., a Java Virtual Machine), an interpreter, a Common Language Runtime, a high-level language virtual machine, etc.), and/or electronic circuitry disposed on a semiconductor chip (e.g., "logic circuitry" implemented with transistors) designed to execute instructions such as a general-purpose processor and/or a special-purpose processor. Processes taught by the discussion above may also be performed by (in the alternative to a machine or in combination with a machine) electronic circuitry designed to perform the processes (or a portion thereof) without the execution of program code.

The disclosure also relates to an apparatus for performing the operations described herein. This apparatus may be specially constructed for the required purpose, or it may comprise a general-purpose device selectively activated or reconfigured by a computer program stored in the device. Such a computer program may be stored in a non-transitory computer readable storage medium, such as, but not limited to, any type of disk including floppy disks, optical disks, CD-ROMs, and magnetic-optical disks, DRAM (volatile), flash memory, read-only memories (ROMs), RAMs, EPROMs, EEPROMs, magnetic or optical cards, or any type of media suitable for storing electronic instructions, and each coupled to a device bus.

A machine readable medium includes any mechanism for storing information in a form readable by a machine (e.g., a computer). For example, a non-transitory machine readable medium includes read only memory ("ROM"); random access memory ("RAM"); magnetic disk storage media; optical storage media; flash memory devices; etc.

An article of manufacture may be used to store program code. An article of manufacture that stores program code may be embodied as, but is not limited to, one or more non-transitory memories (e.g., one or more flash memories, random access memories (static, dynamic or other)), optical disks, CD-ROMs, DVD ROMs, EPROMs, EEPROMs, magnetic or optical cards or other type of machine-readable media suitable for storing electronic instructions. Program code may also be downloaded from a remote computer (e.g., a server) to a requesting computer (e.g., a client) by way of data signals embodied in a propagation medium (e.g., via a communication link (e.g., a network connection)) and then stored in non-transitory memory (e.g., DRAM or flash memory or both) in the client computer.

The preceding detailed descriptions are presented in terms of algorithms and symbolic representations of operations on data bits within a device memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "receiving," "determining," "sending," "terminating," "waiting," "changing," or the like, refer to the action and processes of a device, or similar electronic computing device, that manipulates and transforms data represented as physical (electronic) quantities within the device's registers and memories into other data similarly represented as physical quantities within the device memories or registers or other such information storage, transmission or display devices.

The processes and displays presented herein are not inherently related to any particular device or other apparatus. Various general-purpose systems may be used with programs in accordance with the teachings herein, or it may prove convenient to construct a more specialized apparatus to perform the operations described. The required structure for a variety of these systems will be evident from the description below. In addition, the disclosure is not described with reference to any particular programming language. It will be appreciated that a variety of programming languages may be used to implement the teachings of the disclosure as described herein.

In the foregoing specification, specific exemplary embodiments have been described. It will be evident that various modifications may be made to those embodiments without departing from the broader spirit and scope set forth in the following claims. The specification and drawings are, accordingly, to be regarded in an illustrative sense rather than a restrictive sense.

What is claimed is:

1. A machine implemented method to create a solver for use in solving simulations of a physical object, the method comprising:
    generating a set of geometry and boundary condition encodings for all variables of a partial differential equation (PDE) that describes a model or law of physics that is used to simulate a physical object in a simulation;
    training a first generative neural network, which is part of a first set of generative neural networks, at a first resolution using a first set of subdomains contained within a domain that represents an overall solution space, the first generative neural network trained to solve the PDE for the set of geometry and boundary condition encodings through a validation of candidate solutions by a discretized version of the PDE;
    training a second generative neural network, which is part of the first set of generative neural networks, at a second resolution using a second set of subdomains contained within the domain, the second generative neural network trained to solve the PDE for the set of geometry and boundary condition encodings through validation of candidate solutions by the discretized version of the PDE;
    wherein the first resolution and the second resolution are different grid resolutions within the domain.

2. The method as in claim 1, wherein the solutions of the PDE by the first generative neural network (NN) are generated independently of the solutions of the PDE by the second generative NN, and wherein each subdomain in the first set of subdomains has a first size and each subdomain in the second set of subdomains has a second size that is different than the first size and wherein the PDE has coupled variables.

3. The method as in claim 1, wherein the method further comprises:
    combining trained solutions from the first generative neural network and the second generative neural network to provide a combined set of trained solutions;
    training a third generative neural network to provide solutions for decoupled variables of the PDE based on the combined set of trained solutions.

4. The method as in claim 3, wherein the third generative neural network is trained in separate latent vector spaces, with a latent vector space for each of the decoupled variables such that a solution for a decoupled variable has its own representation in its own encoded latent vector space.

5. The method as in claim 4, wherein the third generative neural network comprises: encoder networks that encode PDE solutions to latent space vectors for each of the decoupled variables; and decoder networks that decode latent space vectors to PDE solutions for each of the decoupled variables.

6. The method as in claim 3, wherein the method further comprises:
    training a set of neighborhood generative neural networks to learn relationships, in an encoded latent vector space, among neighboring subdomains within the domain, wherein the set of neighborhood generative neural networks comprises a plurality of neighborhood generative neural networks.

7. The method as in claim 6, wherein the method further comprises:

classifying each of the subdomains, based upon their position in the domain, into one of three classes: an interior subdomain; a boundary subdomain; and a corner subdomain; and wherein the plurality of neighborhood generative neural networks comprises: an interior subdomain neighborhood generative neural network to train based on data associated with subdomains classified as an interior subdomain; a boundary subdomain neighborhood generative neural network to train based on data associated with subdomains classified as a boundary subdomain; and a corner subdomain neighborhood generative neural network to train based on data associated with subdomains classified as a corner subdomain.

8. The method as in claim 6, wherein the decoupled variables are coupled by the set of neighborhood generative neural networks by concatenating their latent vectors in the latent spaces.

9. The method as in claim 8, wherein the method further comprises:

generating a deployable neural network for use in a solver to solve PDEs in simulations of physical systems, the deployable neural network based on results from the first set of generative neural networks, the third generative neural network and the set of neighborhood neural networks.

10. The method as in claim 3, wherein all trained solutions from the first set of generative neural networks are combined in a combined set of subdomains, and wherein the combining comprises sampling values from all of the trained solutions.

11. A non-transitory machine readable medium storing executable program instructions which, when executed by a data processing system, cause the data processing system to perform a method, the method comprising:

receiving geometry data that specifies a domain and receiving one or more boundary conditions for a physical system to be simulated by one or more solutions of a partial differential equation (PDE);

storing neighborhood connectivity data for subdomains of the domain;

initializing the domain with an initial solution for each variable in the PDE;

solving the PDE, the solving comprising: encoding a solution for each variable in the latent vector space using a trained encoder neural network of a generative neural network that was trained by a set of training generative neural networks that operated at different resolutions in a solution space.

12. The medium as in claim 11, wherein the method further comprises:

dividing the domain into the subdomains that are classified into different classes of subdomains based on their positions in the domain.

13. The medium as in claim 11, wherein an encoder encodes, during the encoding, a current solution in each subdomain for each variable in the PDE in the latent vector space that is decoupled, from the other variables, in the PDE; and wherein the solving, after the encoding, comprises:

coupling the PDE variables by concatenating their latent vectors derived from the encoding in each subdomain;

determining, by a set of neighborhood generative neural networks, a next encoded solution for each variable in the PDE in the latent vector space;

uncoupling, after the next encoded solutions have been determined, the PDE variables and enforcing the boundary conditions and geometry encodings in the latent vector space;

iterating, until convergence of a solution of the PDE is achieved based upon a convergence criterion, the operations of coupling, determining and uncoupling;

generating, by a trained decoder neural network of the generative neural network, solutions from converged encoded solutions in the latent vector space in each subdomain and deriving, from the network connectivity data, final solutions for all variables of the PDE over the domain.

14. The medium as in claim 13, wherein the data processing system stores weights for use in the method, the weights including: trained weights for the trained encoder neural network of the generative neural network; trained weights for the trained decoder neural network of the generative neural network; trained weights for the set of neighborhood generative neural networks; and trained weights of geometry and boundary condition neural networks.

15. The medium as in claim 13, wherein the initial solution is a random solution and wherein the current solution is initially the initial solution and wherein the PDE has coupled variables.

16. The medium as in claim 13, wherein the set of training generative neural networks generated, prior to beginning the method, training data that trained the trained decoder neural network of the generative neural network and trained the set of neighborhood generative neural networks.

17. A non-transitory machine readable medium storing executable program instructions which, when executed by a data processing system, cause the data processing system to perform a method, the method comprising:

generating a set of geometry and boundary condition encodings for all variables of a partial differential equation (PDE) that describes a model or law of physics that is used to simulate a physical object in a simulation;

training a first generative neural network, which is part of a first set of generative neural networks, at a first resolution using a first set of subdomains contained within a domain that represents an overall solution space, the first generative neural network trained to solve the PDE for the set of geometry and boundary condition encodings through a validation of candidate solutions by a discretized version of the PDE;

training a second generative neural network, which is part of the first set of generative neural networks, at a second resolution using a second set of subdomains contained within the domain, the second generative neural network trained to solve the PDE for the set of geometry and boundary condition encodings through validation of candidate solutions by the discretized version of the PDE;

wherein the first resolution and the second resolution are different grid resolutions within the domain.

18. The medium as in claim 17, wherein the solutions of the PDE by the first generative neural network (NN) are generated independently of the solutions of the PDE by the second generative NN, and wherein each subdomain in the first set of subdomains has a first size and each subdomain in the second set of subdomains has a second size that is different than the first size and wherein the PDE has coupled variables.

19. The medium as in claim 17, wherein the method further comprises:
  combining trained solutions from the first generative neural network and the second generative neural network to provide a combined set of trained solutions;
  training a third generative neural network to provide solutions for decoupled variables of the PDE based on the combined set of trained solutions.

20. The medium as in claim 19, wherein the third generative neural network is trained in separate latent vector spaces, with a latent vector space for each of the decoupled variables such that a solution for a decoupled variable has its own representation in its own encoded latent vector space.

21. The medium as in claim 20, wherein the third generative neural network comprises:
  encoder networks that encode PDE solutions to latent space vectors for each of the decoupled variables; and
  decoder networks that decode latent space vectors to PDE solutions for each of the decoupled variables.

22. The medium as in claim 19, wherein the method further comprises:
  training a set of neighborhood generative neural networks to learn relationships, in an encoded latent vector space, among neighboring subdomains within the domain, wherein the set of neighborhood generative neural networks comprises a plurality of neighborhood generative neural networks.

23. The medium as in claim 22, wherein the method further comprises:
  classifying each of the subdomains, based upon their portion in the domain, into one of three classes: an interior subdomain; a boundary subdomain; and a corner subdomain; and wherein the plurality of neighborhood generative neural networks comprises: an interior subdomain neighborhood generative neural network to train based on data associated with subdomains classified as an interior subdomain; a boundary subdomain neighborhood generative neural network to train based on data associated with subdomains classified as a boundary subdomain; and a corner subdomain neighborhood generative neural network to train based on data associated with subdomains classified as a corner subdomain.

24. The medium as in claim 22, wherein the decoupled variables are coupled by the set of neighborhood generative neural networks by concatenating their latent vectors in the latent spaces.

25. The medium as in claim 24, wherein the method further comprises:
  generating a deployable neural network for use in a solver to solve PDEs in simulations of physical systems, the deployable neural network based on results from the first set of generative neural networks, the third generative neural network and the set of neighborhood neural networks.

26. The medium as in claim 19, wherein all trained solutions from the first set of generative neural networks are combined in a combined set of subdomains, and wherein the combining comprises sampling values from all of the trained solutions.

* * * * *